(12) United States Patent
Liao et al.

(10) Patent No.: US 12,550,691 B2
(45) Date of Patent: Feb. 10, 2026

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Chun Hao Liao, Hsinchu (TW); Chu Fu Chen, Hsinchu County (TW); Chun-Wei Hsu, Taichung (TW); Chia-Cheng Pao, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 42 days.

(21) Appl. No.: 18/496,906

(22) Filed: Oct. 29, 2023

(65) Prior Publication Data
US 2024/0055295 A1 Feb. 15, 2024

Related U.S. Application Data

(62) Division of application No. 17/353,618, filed on Jun. 21, 2021, now Pat. No. 11,842,920, which is a division of application No. 16/371,900, filed on Apr. 1, 2019, now Pat. No. 11,075,107.

(60) Provisional application No. 62/738,499, filed on Sep. 28, 2018.

(51) Int. Cl.
| | | |
|---|---|---|
| *H10D 84/83* | (2025.01) | |
| *H01L 21/762* | (2006.01) | |
| *H10D 30/01* | (2025.01) | |
| *H10D 30/60* | (2025.01) | |
| *H10D 62/10* | (2025.01) | |
| *H10D 64/27* | (2025.01) | |
| *H10D 84/01* | (2025.01) | |
| *H10D 84/03* | (2025.01) | |

(52) U.S. Cl.
CPC ..... *H01L 21/76224* (2013.01); *H10D 30/021* (2025.01); *H10D 84/0151* (2025.01); *H10D 84/038* (2025.01); *H10D 84/83* (2025.01)

(58) Field of Classification Search
CPC .. H10D 64/519; H10D 84/0151; H10D 84/83; H10D 62/115; H10D 30/021; H10D 30/60; H01L 21/76224
See application file for complete search history.

(56) References Cited

U.S. PATENT DOCUMENTS

| | | | | |
|---|---|---|---|---|
| 6,709,936 | B1 * | 3/2004 | Naem | H10D 30/60 438/156 |
| 6,777,756 | B2 * | 8/2004 | Ohguro | H10D 64/519 257/E29.136 |
| 2004/0207027 | A1 * | 10/2004 | Wu | H10D 30/645 257/E29.136 |

(Continued)

*Primary Examiner* — Antonio B Crite
(74) *Attorney, Agent, or Firm* — WPAT LAW; Anthony King

(57) ABSTRACT

The present disclosure provides a semiconductor structure, including a transistor. The transistor includes a semiconductive substrate, a gate structure, a pair of highly doped regions and a dielectric element. The semiconductive substrate has a top surface. The gate structure is over the top surface. The pair of highly doped regions is separated by the gate structure. The dielectric element is embedded in the semiconductive substrate. The dielectric element is laterally and vertically misaligned with the pair of highly doped regions.

20 Claims, 56 Drawing Sheets

(56) References Cited

U.S. PATENT DOCUMENTS

2012/0280291 A1\* 11/2012 Lee .................. H01L 21/28123
257/288

\* cited by examiner

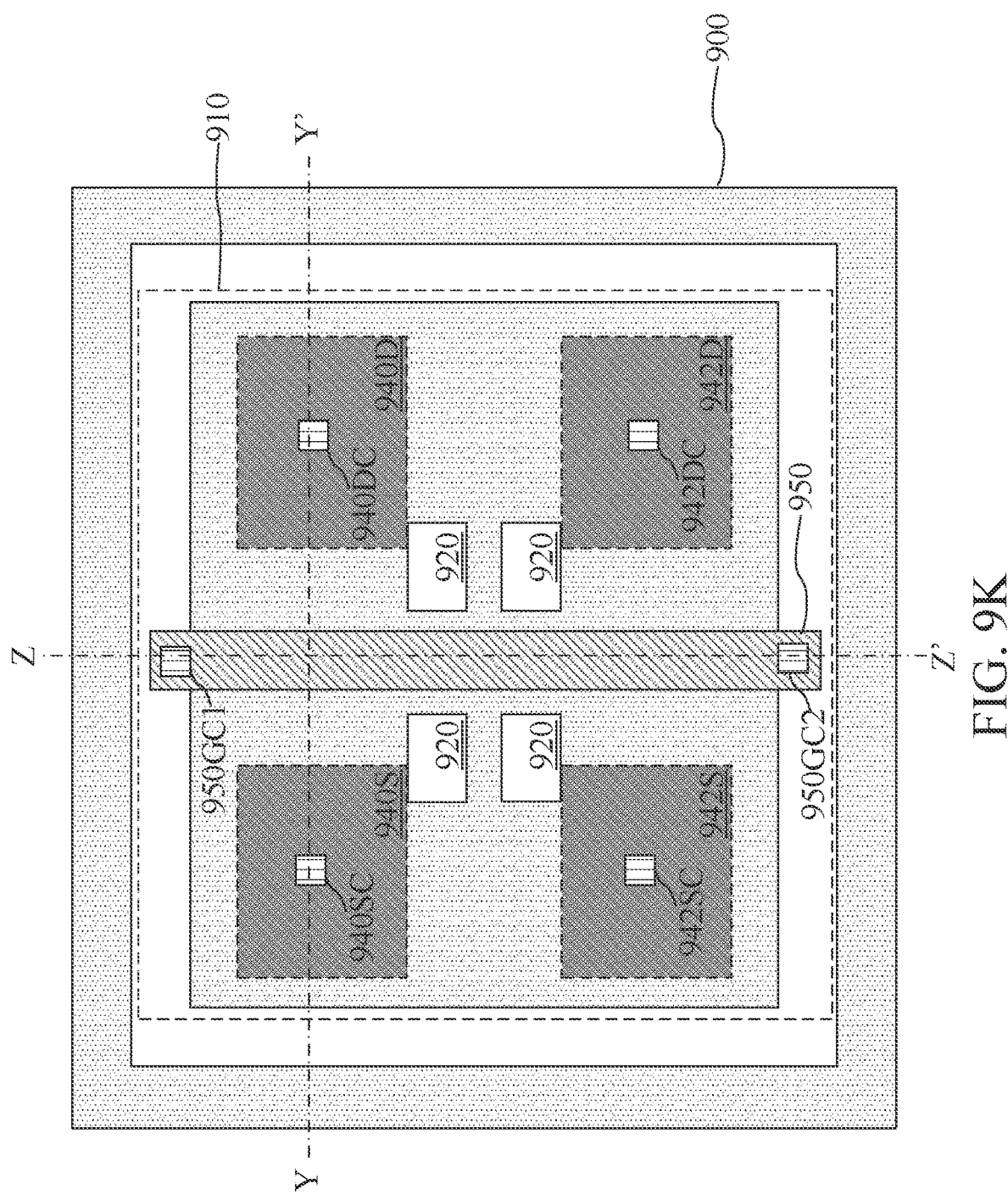

SEMICONDUCTOR STRUCTURE AND MANUFACTURING METHOD THEREOF

PRIORITY CLAIM AND CROSS-REFERENCE

This application is a divisional application of U.S. application Ser. No. 17/353,618 filed on Jun. 21, 2021, entitled of "SEMICONDUCTOR STRUCTURE AND MANUFACTURING METHOD THEREOF", which is a divisional application of U.S. application Ser. No. 16/371,900 filed on Apr. 1, 2019, entitled of "SEMICONDUCTOR STRUCTURE AND MANUFACTURING METHOD THEREOF", which claims the benefit of U.S. Provisional Patent Application Ser. No. 62/738,499 filed Sep. 28, 2018, the entire disclosure of which is hereby incorporated by reference.

BACKGROUND

Power device is always the major device of power driver products. As for a high voltage or medium voltage power device, large oxide diffusion area may be necessary for bearing high applied voltage or medium applied voltage. Large oxide diffusion area always suffers more stresses during the manufacturing processes of the power device. Consequently, crystal defects which may induce current leakage of the power device may increase in the large oxide diffusion area of the power device.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 8A-8J are cross-sections and top views of a semiconductor structure at various stages of manufacture in accordance with some embodiments of the present disclosure.

FIGS. 9A-9M are cross-sections and top views of a semiconductor structure at various stages of manufacture in accordance with some embodiments of the present disclosure.

FIGS. 10A-10M are cross-sections and top views of a semiconductor structure at various stages of manufacture in accordance with some embodiments of the present disclosure.

DETAILED DESCRIPTION

Figure 1:
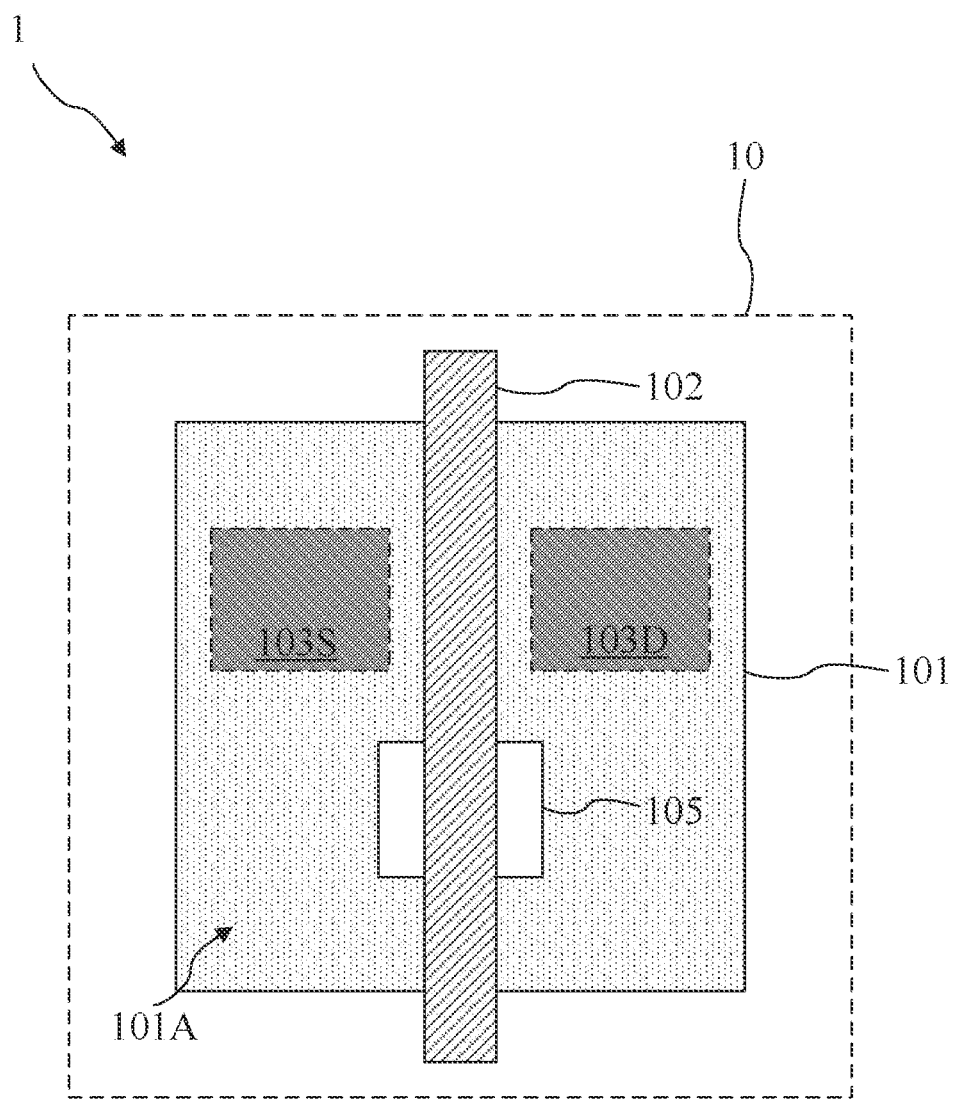
FIG. 1 is a top view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

FIG. 1 is a top view of a semiconductor structure 1 in accordance with some embodiments of the present disclosure. The semiconductor structure 1 includes a transistor 10. The transistor 10 includes a semiconductive substrate 101, a gate structure 102, a first pair of highly doped regions 103S and 103D and a dielectric element 105.

The semiconductive substrate 101 has a top surface 101A. The gate structure 102 may be formed over the top surface 101A. The doped regions 103S and 103D may be separated by the gate structure 102. The dielectric element 105 may be embedded in the semiconductive substrate 101. The dielectric element 105 may be misaligned with the doped regions 103S and 103D. In detail, the dielectric element 105 may be laterally and vertically misaligned with the doped regions 103S and 103D.

Figure 2A:
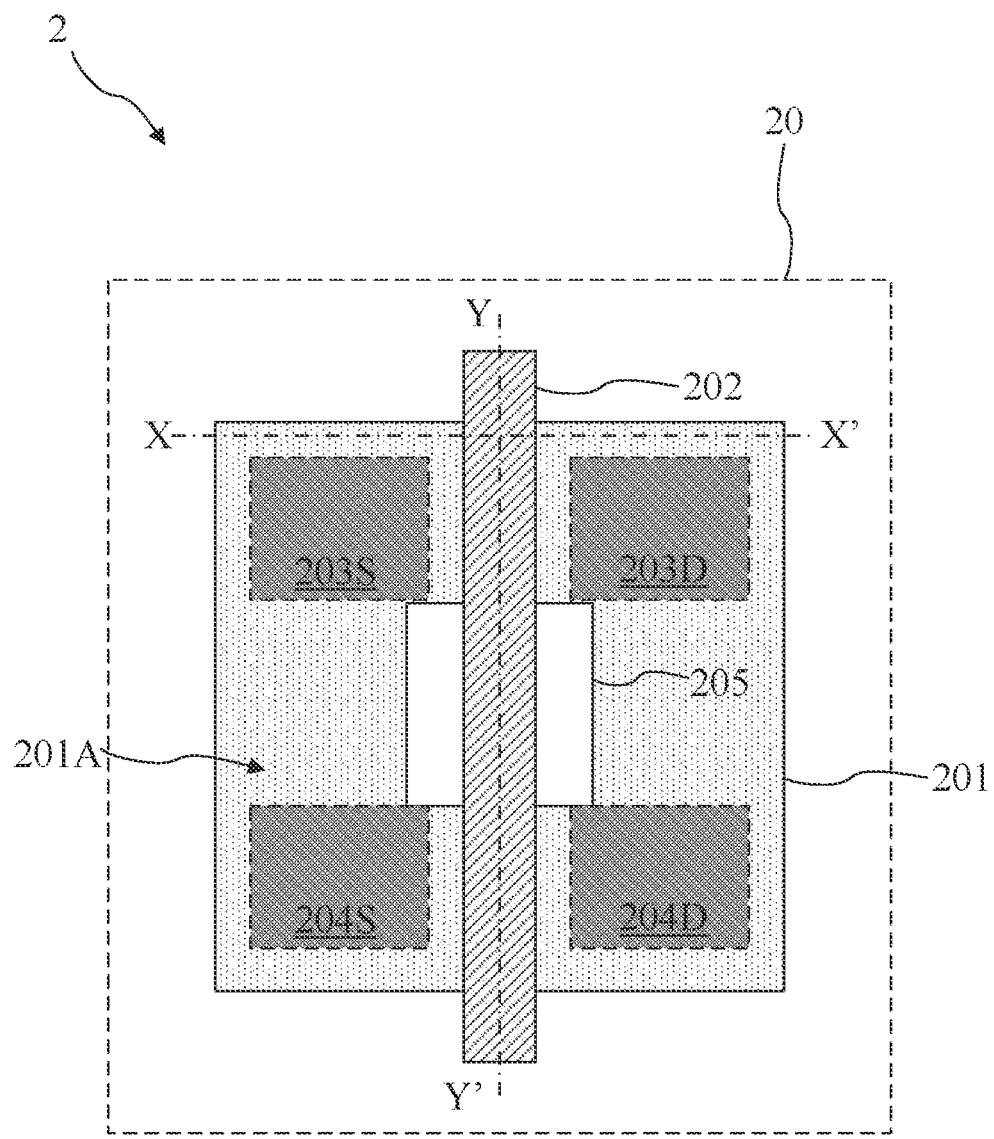
FIG. 2A is a top view of a semiconductor structure in accordance with some embodiments of the present disclosure.

FIG. 2A is a top view of a semiconductor structure 2 in accordance with some embodiments of the present disclosure. The semiconductor structure 2 includes a transistor 20. The transistor 20 includes a semiconductive substrate 201, a gate structure 202, a first pair of highly doped regions 203S and 203D, a second pair of highly doped regions 204S and 204D and a dielectric element 205.

The semiconductive substrate 201 has a top surface 201A. The gate structure 202 may be formed over the top surface 201A. The doped regions 203S and 203D may be separated by the gate structure 202. The doped regions 204S and 204D may be separated by the gate structure 202. The dielectric element 205 may be embedded in the semiconductive substrate 201. The dielectric element 205 may be misaligned with the doped regions 203S and 203D and misaligned with the doped regions 204S and 204D. In detail, the dielectric element 205 may be laterally and vertically misaligned with the doped regions 203S and 203D. Further, the dielectric element 205 may be laterally and vertically misaligned with the doped regions 204S and 204D. In some embodiments, the dielectric element 205 may be formed under the gate structure 202.

Figure 2B:
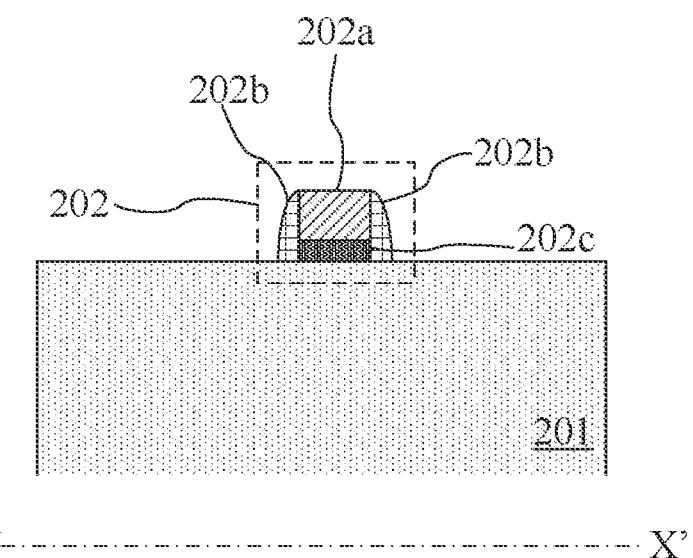
FIGS. 2B and 2C are cross-sections of the semiconductor structure in accordance with some embodiments of the present disclosure.
Figure 2C:
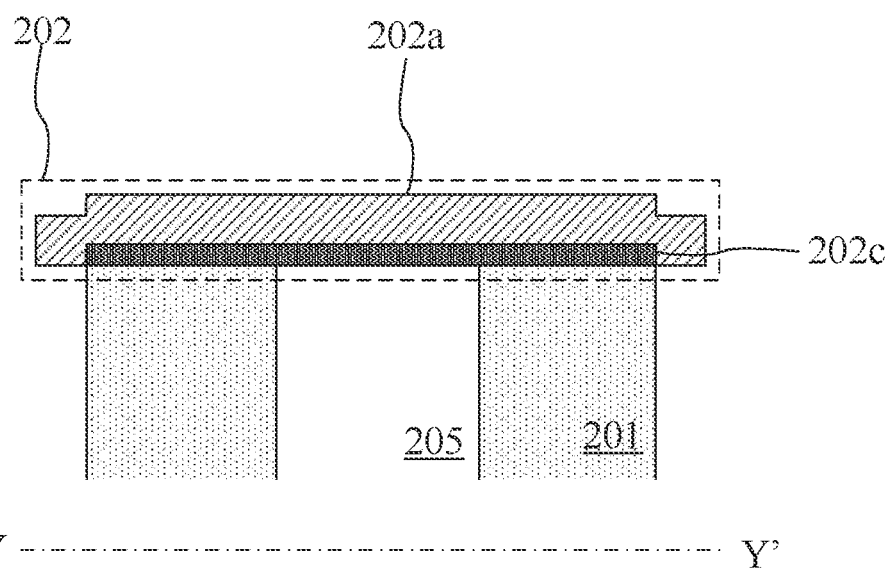

FIGS. 2B and 2C are cross-sections of the semiconductor structure 2 in accordance with some embodiments of the present disclosure. The gate structure 202 includes a gate electrode 202a, spacers 202b and a dielectric layer 202c. The dielectric layer 202c may be formed between the semiconductive substrate 201 and the gate electrode 202a. The spacers 202b may be formed over the semiconductive substrate 201. The spacers 202b cover the dielectric layer 202c and part of the gate electrode 202a. In some embodiments, the spacers 202b cover two sides of the stack of the dielectric layer 202c and the gate electrode 202a, and a surface of the gate electrode 202a may be exposed between the spacers 202b.

Figure 2D:
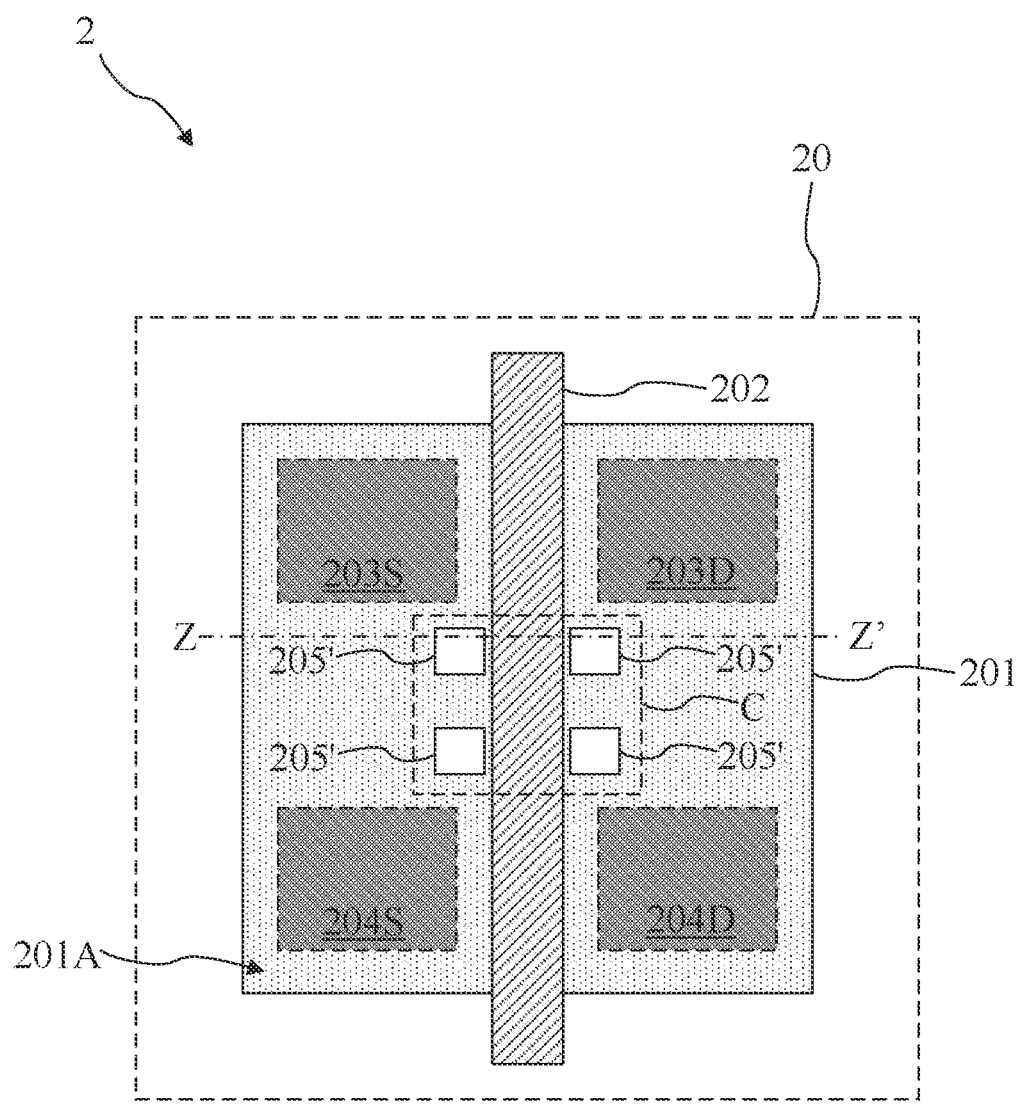
FIG. 2D is a top view of a semiconductor structure in accordance with some embodiments of the present disclosure.
Figure 2E:
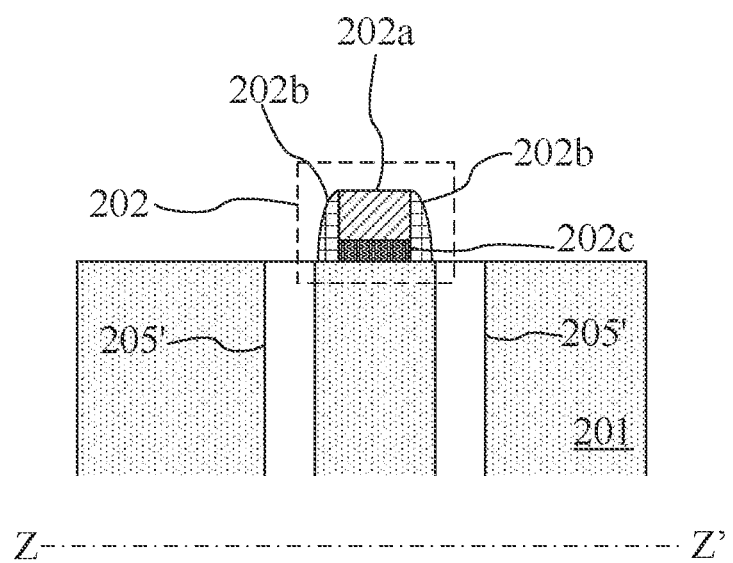
FIG. 2E is a cross-section of the semiconductor structure in accordance with some embodiments of the present disclosure.

FIG. 2D is a top view of the semiconductor structure 2 in accordance with some embodiments of the present disclosure. FIG. 2E is a cross-section of the semiconductor structure 2 in accordance with some embodiments of the present disclosure. As shown in FIGS. 2D and 2E, the transistor 20 includes a plurality of dielectric elements 205'. Each of the plurality of dielectric elements 205' may be laterally and vertically misaligned with the doped regions 203S and 203D. Further, each of the plurality of dielectric elements 205' may be laterally and vertically misaligned with the doped regions 204S and 204D. In some embodiments, the dielectric elements 205' may be formed within a center area C related to the top surface 201A of the semiconductive substrate 201.

Figure 3A:
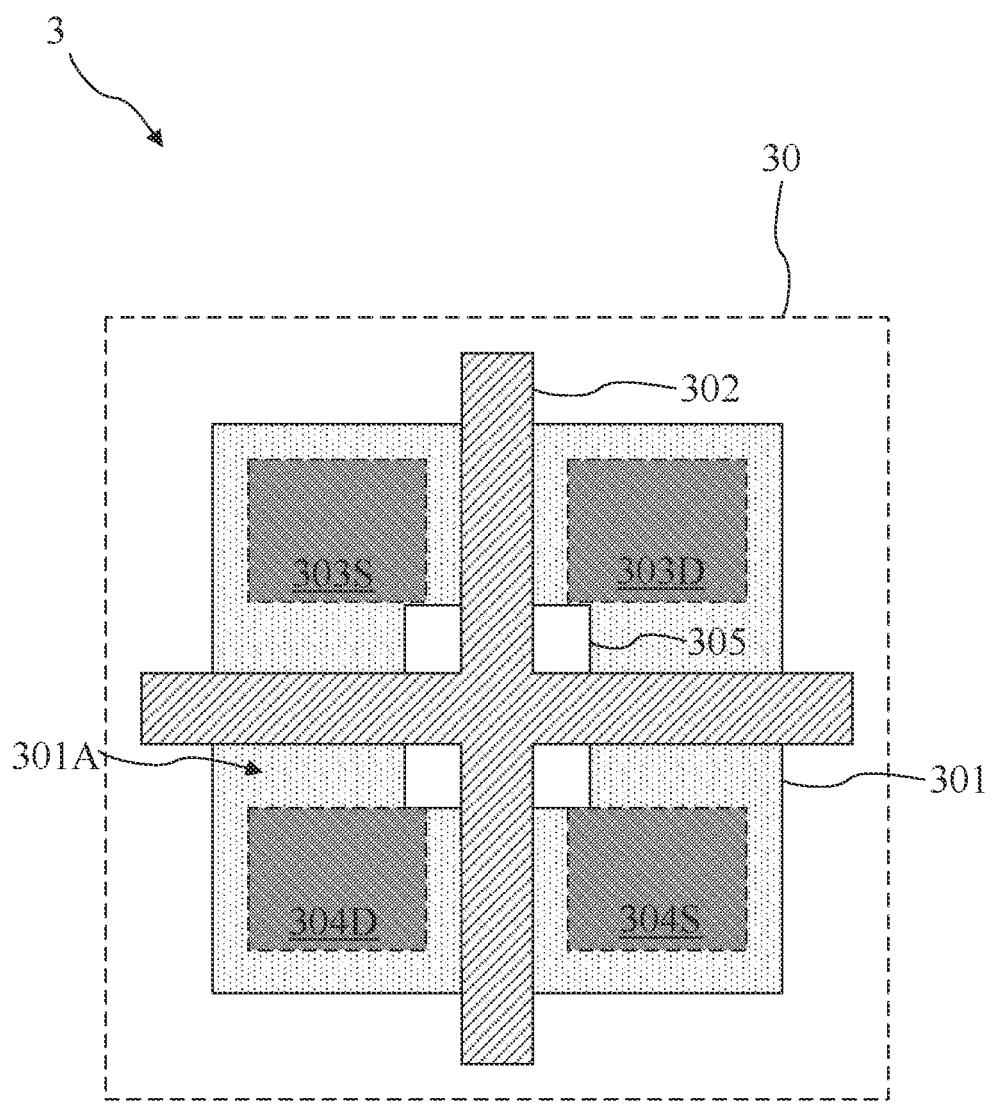
FIGS. 3A to 3B are top views of a semiconductor structure in accordance with some embodiments of the present disclosure.

FIG. 3A is a top view of a semiconductor structure 3 in accordance with some embodiments of the present disclosure. The semiconductor structure 3 includes a transistor 30. The transistor 30 includes a semiconductive substrate 301, a gate structure 302, a first pair of highly doped regions 303S and 303D, a second pair of highly doped regions 304S and 304D and a dielectric element 305.

The semiconductive substrate 301 has a top surface 301A. The gate structure 302 is disposed over the top surface 301A. The gate structure 302 may be in a shape of crisscross. The doped regions 303S and 303D are separated by the gate structure 302. The doped regions 304S and 304D are separated by the gate structure 302. In some embodiments, the doped regions 303S and 304S may be source regions of the transistor 30. The doped regions 303D and 304D may be drain regions of the transistor 30.

In some embodiments, the gate structure 302 with the shape of crisscross defines the semiconductive substrate 301 of the transistor 301 as four parts. Further, relative to the four parts defined in the semiconductive substrate 301 of the transistor 30, the doped regions 303S and 304S may be formed diagonally in the semiconductive substrate 301 of the transistor 301. Similarly, the doped regions 303D and 304D may be formed diagonally in the semiconductive substrate 301 of the transistor 30. In some embodiments, the source region 303S may be paired with the drain region 304D, and the source region 304S may be paired with the drain region 303D.

The dielectric element 305 is embedded in the semiconductive substrate 301. The dielectric element 305 is misaligned with the doped regions 303S and 303D and misaligned with the doped regions 304S and 304D. In detail, the dielectric element 305 is laterally and vertically misaligned with the doped regions 303S and 303D. Further, the dielectric element 305 is laterally and vertically misaligned with the doped regions 304S and 304D. In some embodiments, the dielectric element 305 is formed under the gate structure 303 with the shape of crisscross.

Figure 3B:
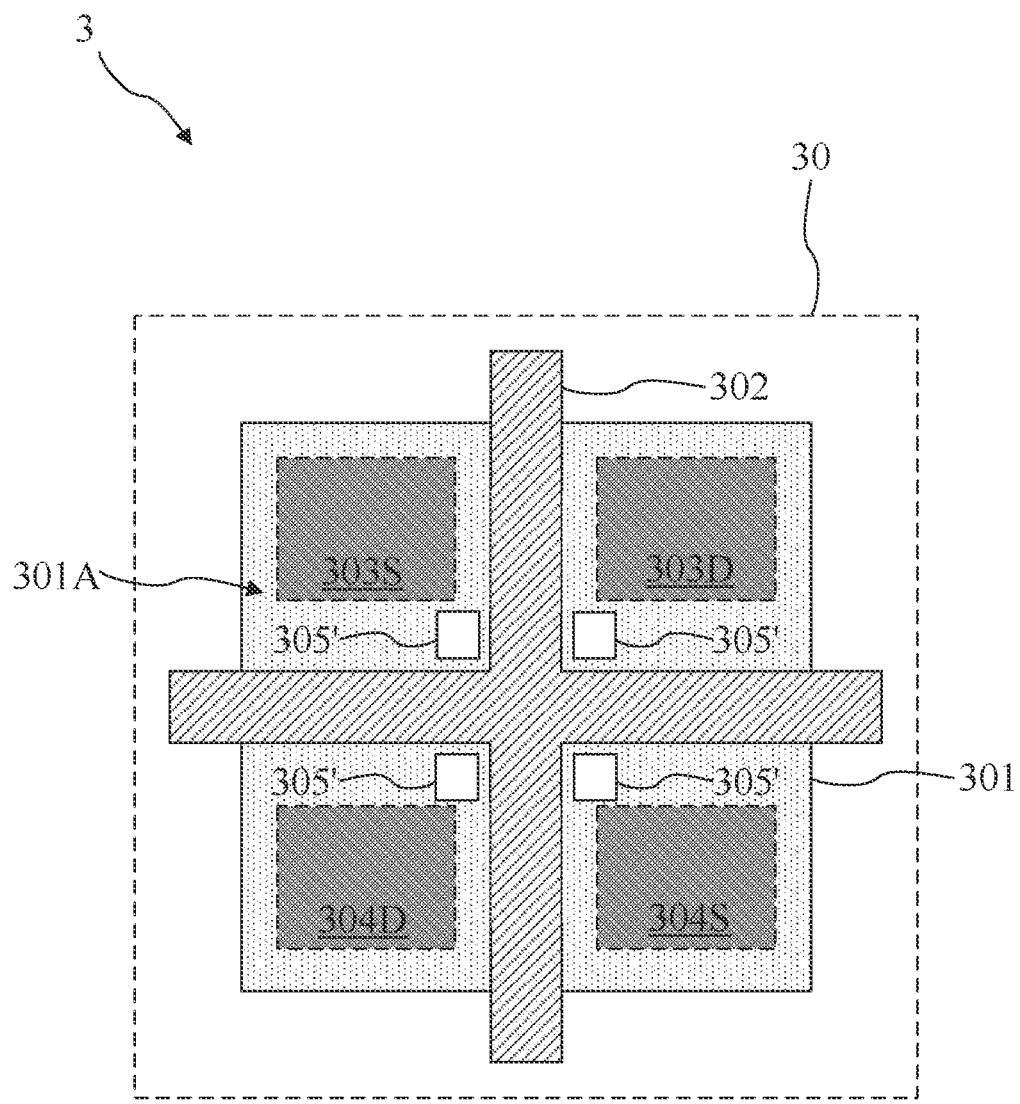

FIG. 3B is a top view of the semiconductor structure 3 in accordance with some embodiments of the present disclosure. As shown in FIG. 3B, the transistor 30 includes a plurality of dielectric elements 305'. Each of the plurality of dielectric elements 305' may be laterally and vertically misaligned with the doped regions 303S and 303D. Further, each of the plurality of dielectric elements 305' may be laterally and vertically misaligned with the doped regions 304S and 304D.

Figure 4A:
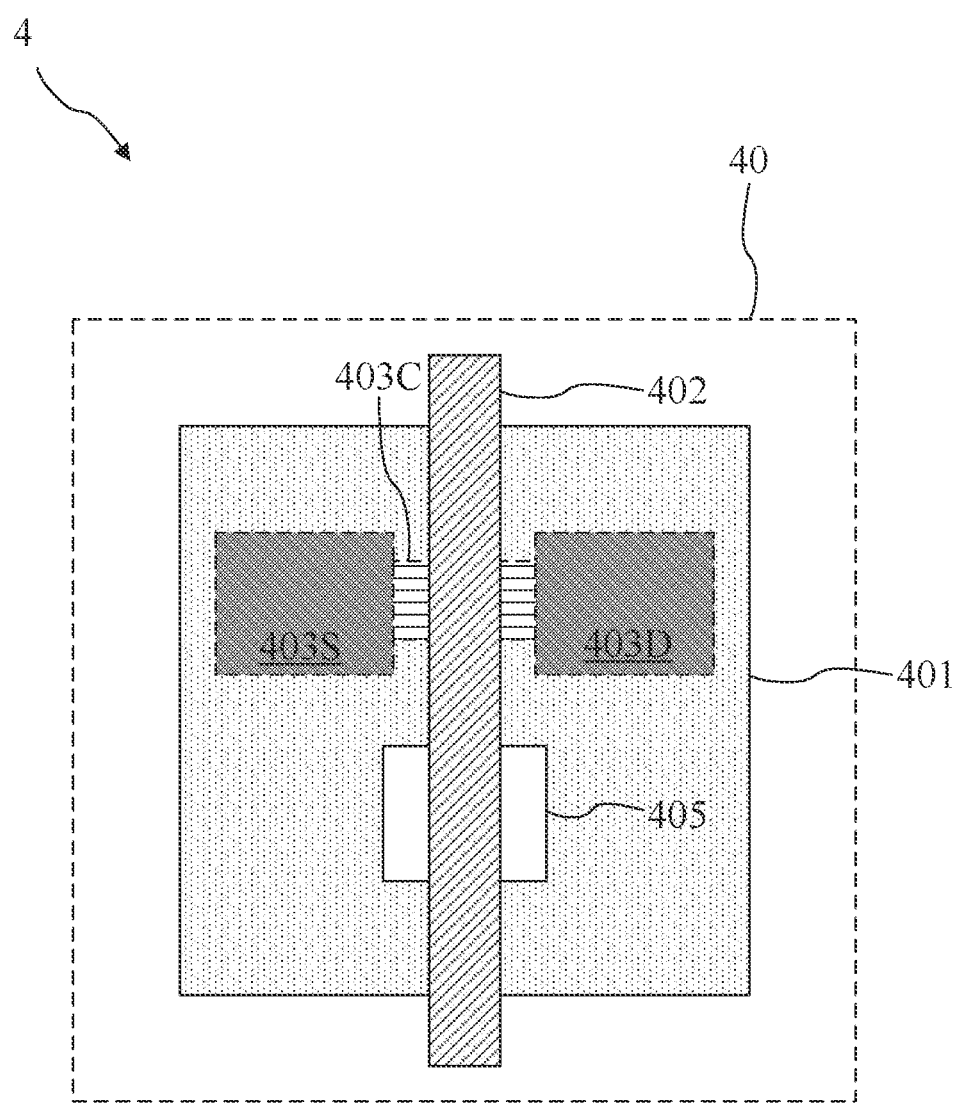
FIGS. 4A to 4C are top views of a semiconductor structure in accordance with some embodiments of the present disclosure.

FIG. 4A is a top view of a semiconductor structure 4 in accordance with some embodiments of the present disclosure. The semiconductor structure 4 includes a transistor 40. The transistor 40 includes a semiconductive substrate 401, a gate 402, a source region 403S, a drain region 403D and an isolation component 405.

The source region 403S and the drain region 403D may be formed in the semiconductor substrate 401. The gate 402 may be formed over the semiconductor substrate 401 and between the source region 403S and the drain region 403D. There may be a channel 403C between the source region 403S and the drain region 403D. The isolation component 405 may be embedded in the semiconductive substrate 401. In detail, the isolation component 405 may be spaced apart from the channel 403C between the source region 403S and the drain region 403D. In other words, the formation of the isolation component 405 may not block the channel 403C between the source region 403S and the drain region 403D.

Figure 4B:
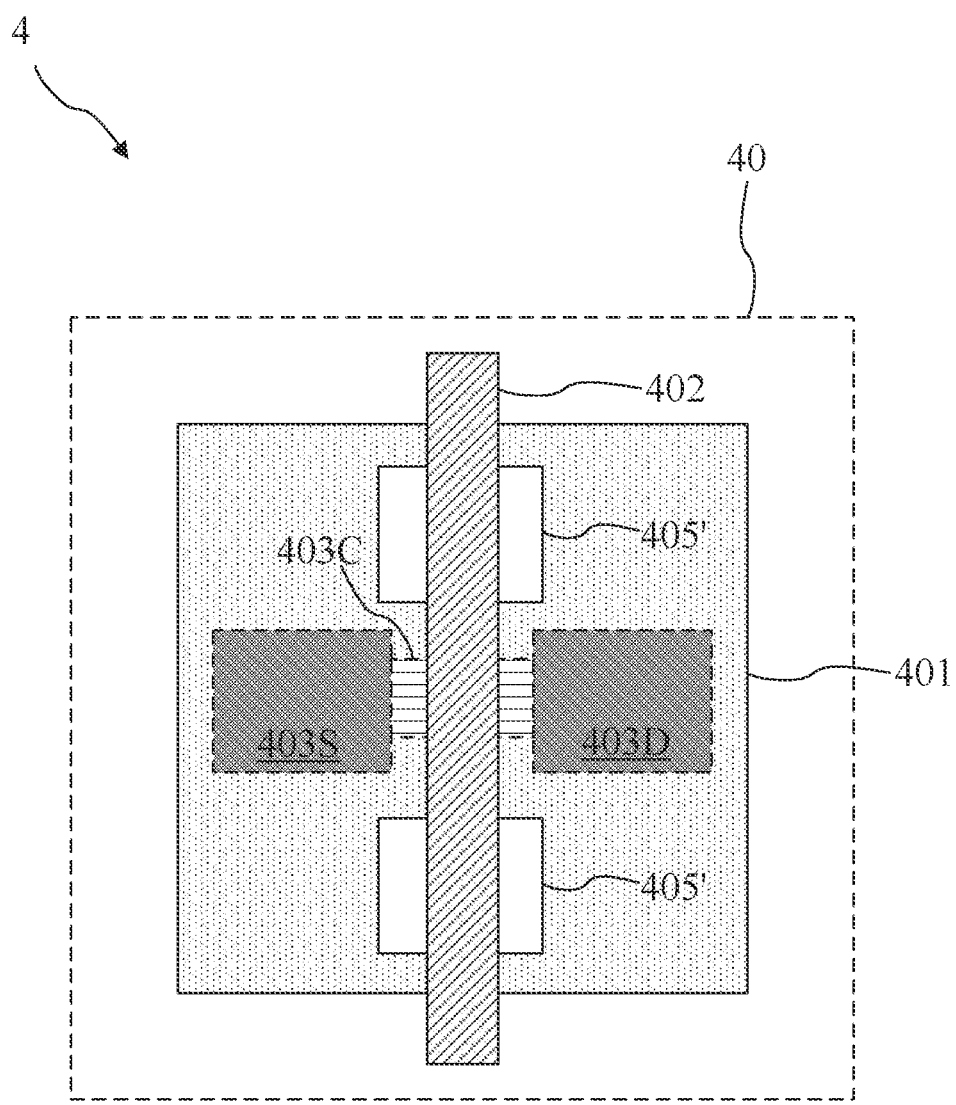

FIG. 4B is a top view of the semiconductor structure 4 in accordance with some embodiments of the present disclosure. The transistor 40 includes two isolation components 405'. The isolation components 405' may be embedded in the semiconductive substrate 401. In detail, both of the isolation components 405' may be spaced apart from the channel 403C between the source region 403S and the drain region 403D. In other words, the formations of the isolation components 405' may not block the channel 403C between the source region 403S and the drain region 403D. In some embodiments, the channel 403C may be a shortest channel between the source region 403S and the drain region 403D.

Figure 4C:
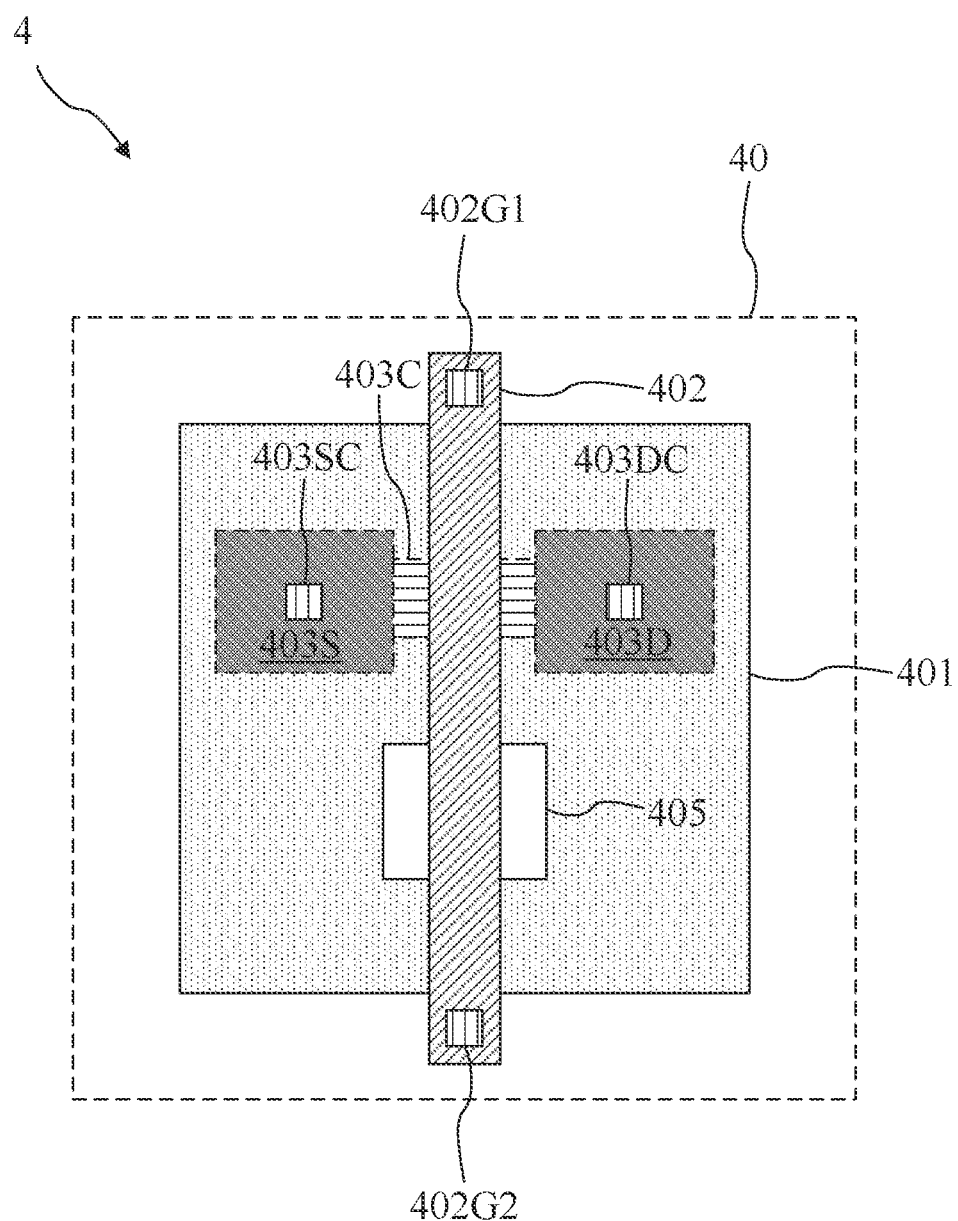

FIG. 4C is a top view of the semiconductor structure 4 in accordance with some embodiments of the present disclosure. The source region 403S has a source contact 403SC. The drain region 403D has a drain contact 403DC. The gate 402 has a pair of gate contacts 402G1 and 402G2. The source contact 403SC and the drain contact 403DC may protrude from the surface of the semiconductive substrate 401. The gate contacts 402G1 and 402G2 may protrude from a surface of the gate 402, and be used for being applied voltage to active the channel 403C.

Figure 5A:
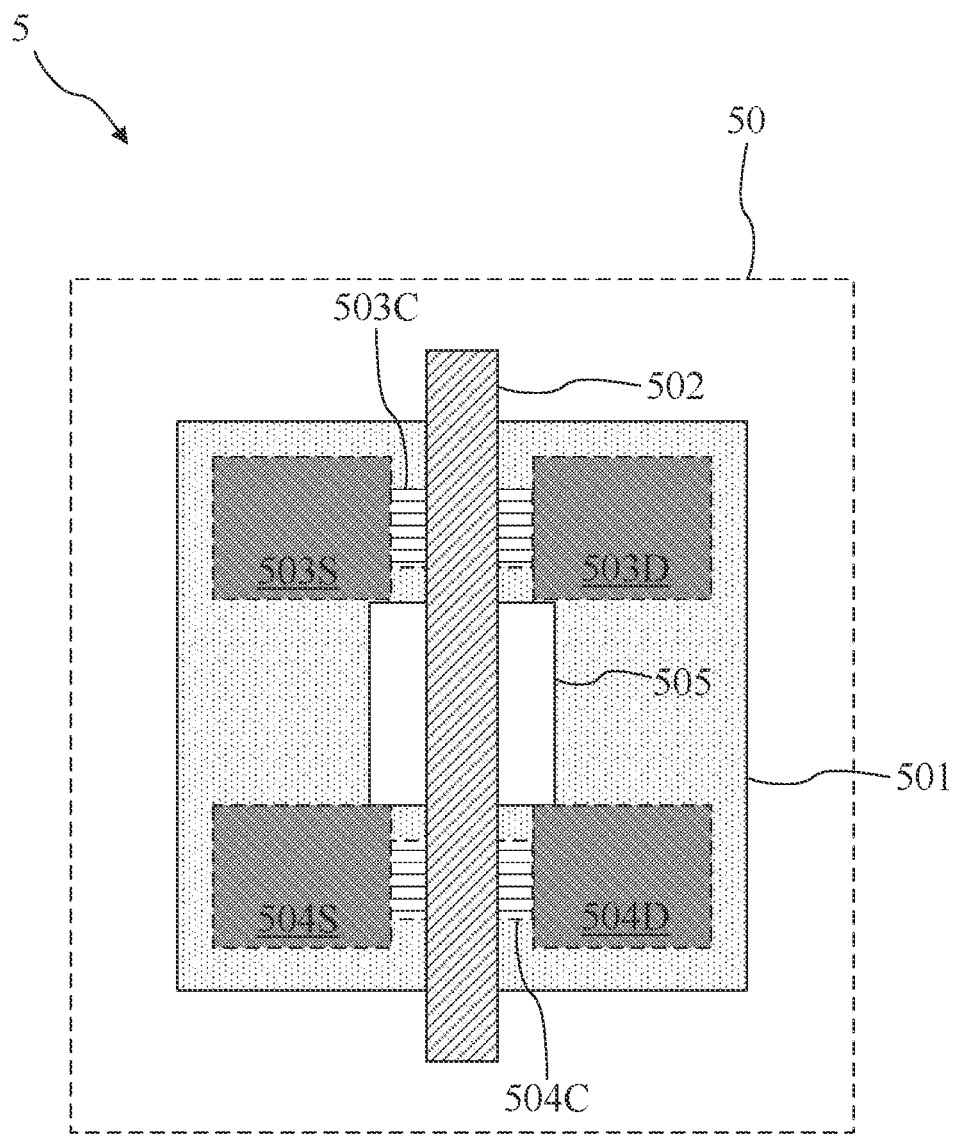
FIGS. 5A and 5B are top views of a semiconductor structure in accordance with some embodiments of the present disclosure.

FIG. 5A is a top view of a semiconductor structure 5 in accordance with some embodiments of the present disclosure. The semiconductor structure 5 includes a transistor 50. The transistor 50 includes a semiconductive substrate 501, a gate 502, a source region 503S, a drain region 503D, a source region 504S, a drain region 504D and an isolation component 505.

The source regions 503S, 504S and the drain regions 503D, 504D may be formed in the semiconductor substrate 501. The gate 502 may be formed over the semiconductor substrate 501. Further, the gate 502 may be formed between the source region 503S and the drain region 503D, and between the source region 504S and the drain region 504D. There may be a channel 503C between the source region 503S and the drain region 503D, and a channel 504C between the source region 504S and the drain region 504D. The isolation component 405 may be embedded in the semiconductive substrate 501.

In detail, the isolation component 505 may be spaced apart from the channel 503C between the source region 503S and the drain region 503D. The isolation component 505 may be spaced apart from the channel 504C between the source region 504S and the drain region 504D. In other words, the formation of the isolation component 505 may not block the channel 503C between the source region 503S and the drain region 503D and may not block the channel 504C between the source region 504S and the drain region 504D.

Figure 5B:
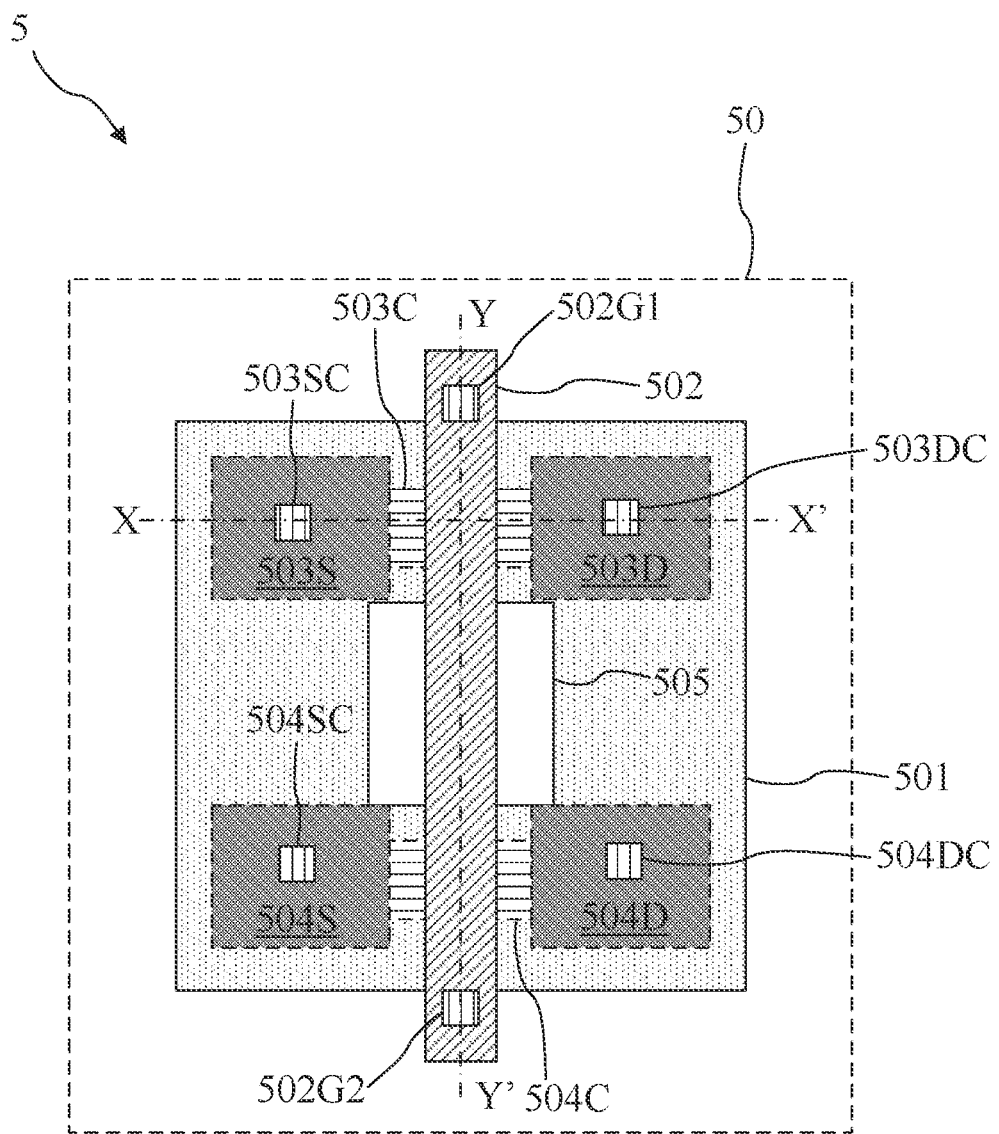

FIG. 5B is a top view of the semiconductor structure 5 in accordance with some embodiments of the present disclosure. The source region 503S has a source contact 503SC. The drain region 503D has a drain contact 503DC. The source region 504S has a 504SC. The drain region 504D has a drain contact 504DC. The gate 502 has a pair of gate contacts 502G1 and 502G2.

Figure 5C:
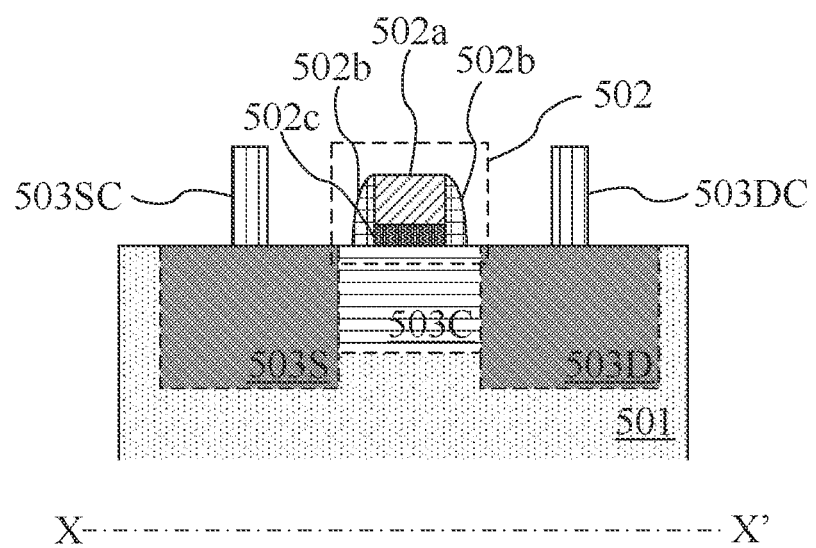
FIGS. 5C and 5D are cross-sections of the semiconductor structure in accordance with some embodiments of the present disclosure.
Figure 5D:
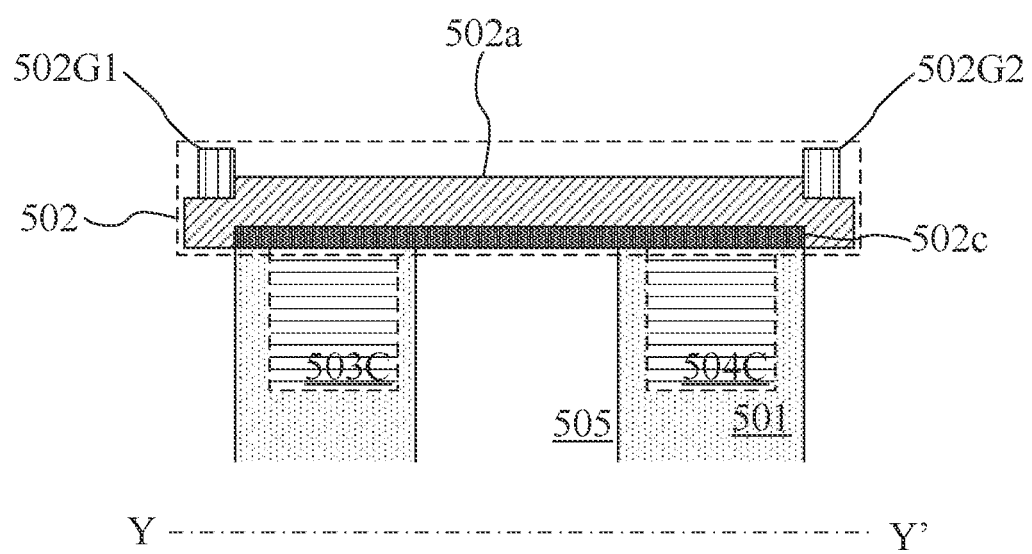

FIGS. 5C and 5D are cross-sections of the semiconductor structure 5 in accordance with some embodiments of the present disclosure. The source contacts 503SC, 504SC and the drain contacts 503DC, 504DC may protrude from the surface of the semiconductive substrate 501. The gate contacts 502G1 and 502G2 may protrude from a surface of the gate 502, and be used for being applied voltage to active the channels 503C and 504C. The gate structure 502 includes a gate electrode 502a, spacers 502b and a dielectric layer 502c. The dielectric layer 502c may be formed between the semiconductive substrate 501 and the gate electrode 502a. The spacers 502b may be formed over the semiconductive substrate 501. The spacers 502b cover the dielectric layer 502c and part of the gate electrode 502a. In some embodiments, the spacers 502b cover two sides of the stack of the dielectric layer 502c and the gate electrode 502a, and a surface of the gate electrode 502a may be exposed between the spacers 502b.

Figure 5E:
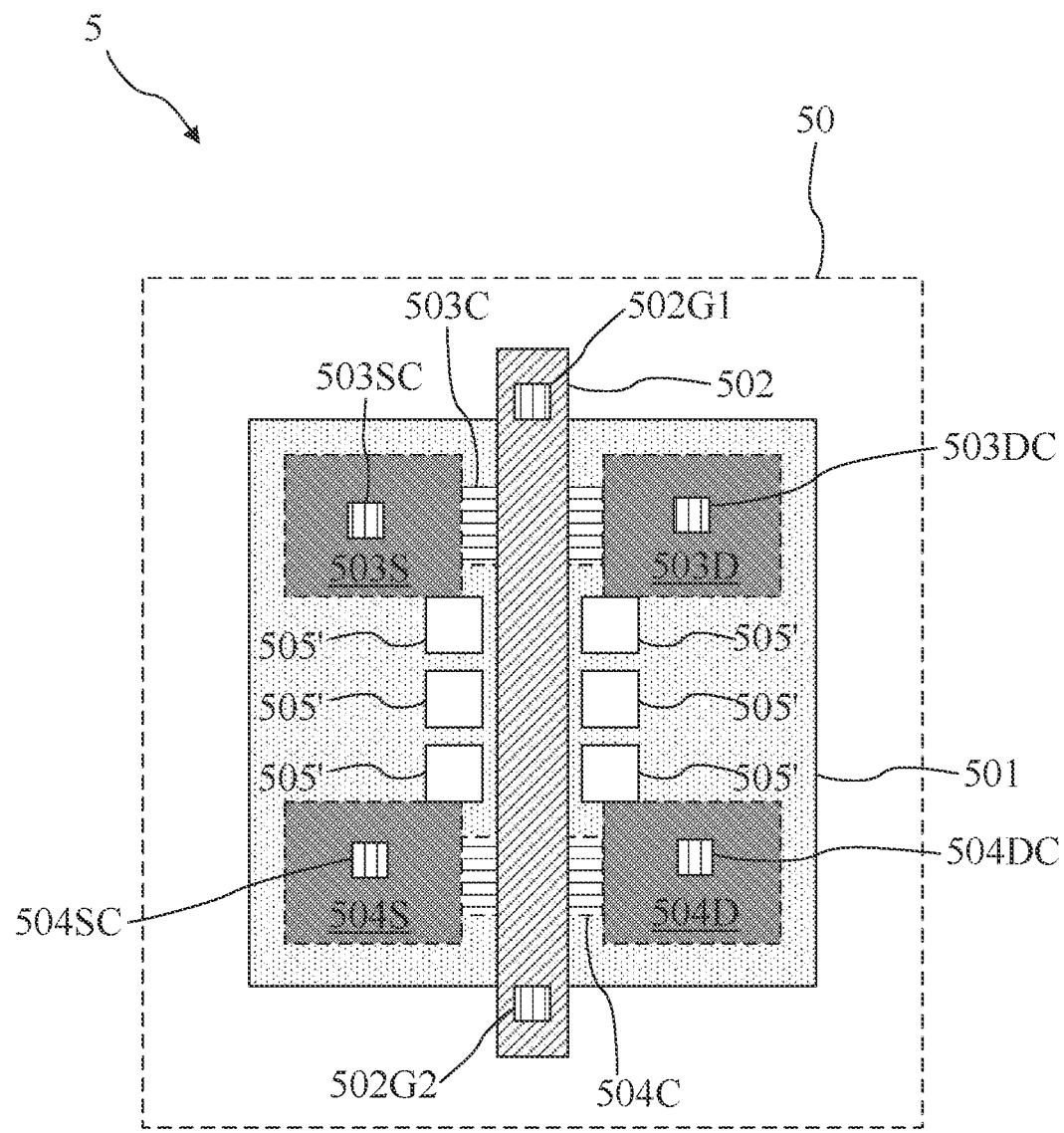
FIG. 5E is a top view of the semiconductor structure in accordance with some embodiments of the present disclosure.

FIG. 5E is a top view of the semiconductor structure 5 in accordance with some embodiments of the present disclosure. As shown in FIG. 5E, the transistor 50 includes a plurality of isolation components 505'. Each of the plurality of isolation components 505' may be spaced apart from the channel 503C between the source region 503S and the drain region 503D. Each of the plurality of the isolation components 505' may be spaced apart from the channel 504C between the source region 504S and the drain region 504D. In other words, the formations of the isolation components 505' may not block the channel 503C between the source region 503S and the drain region 503D and may not block the channel 504C between the source region 504S and the drain region 504D.

Figure 6A:
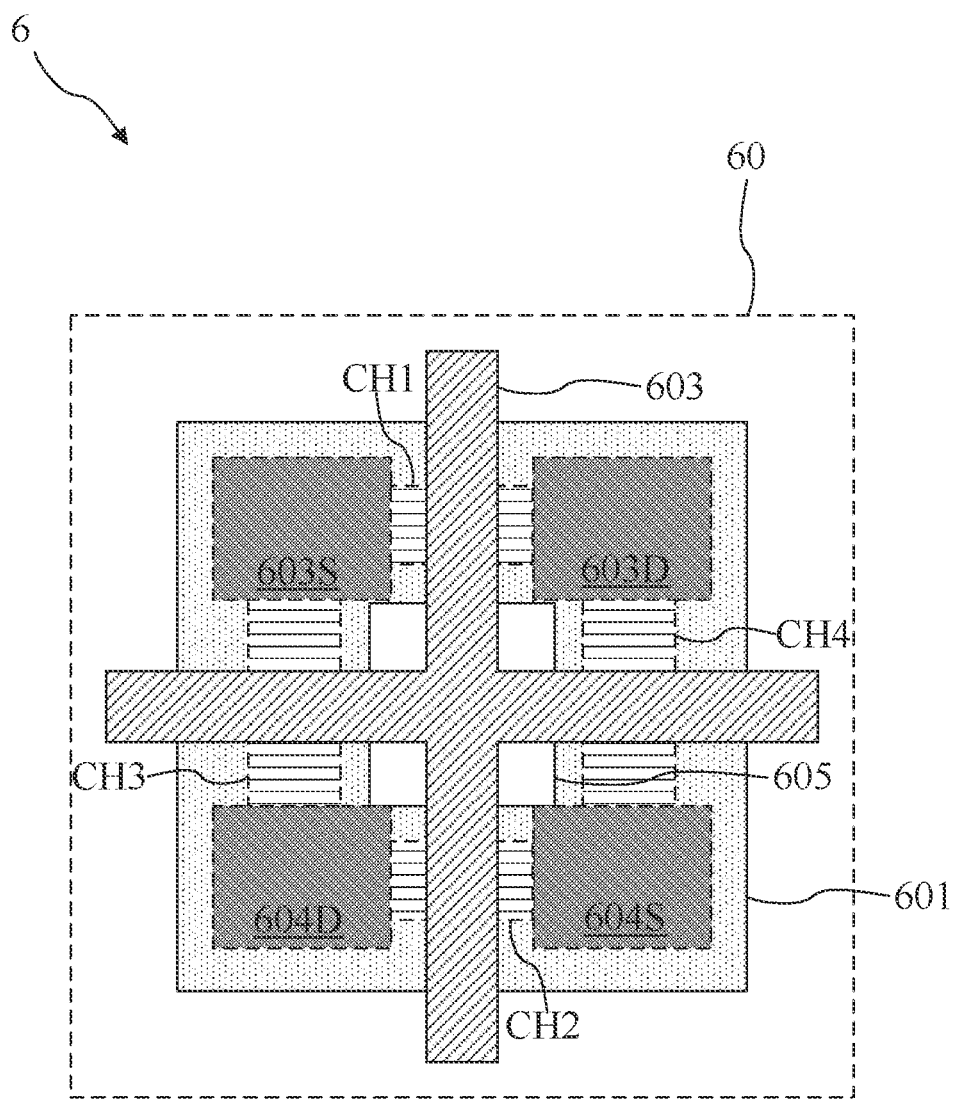
FIGS. 6A to 6C are top views of a semiconductor structure in accordance with some embodiments of the present disclosure.

FIG. 6A is a top view of a semiconductor structure 6 in accordance with some embodiments of the present disclosure. The semiconductor structure 6 includes a transistor 60. The transistor 60 includes a semiconductive substrate 601, a gate structure 602, a source region 603S, a drain region 603D, a source region 604S, a drain region 604D and an isolation component 605.

The source regions 603S, 604S and the drain regions 603D, 604D may be formed in the semiconductor substrate 601. The gate 602 may be formed in a shape of crisscross over the semiconductor substrate 601. The gate structure 602 may be formed between the source region 603S and the drain region 603D, and between the source region 604S and the drain region 604D. In other words, the source region 603S and the drain region 603D are separated by the gate 602. The source region 604S and the drain region 604D are separated by the gate 602.

Further, the gate structure 602 may be formed between the source region 603S and the drain region 604D, and between the source region 604S and the drain region 603D. In other words, the source region 604S and the drain region 603D are separated by the gate 602. The source region 603S and the drain region 604D are separated by the gate 602. Accordingly, there may be a channel CH1 between the source region 603S and the drain region 603D, a channel CH2 between the source region 604S and the drain region 604D, a channel CH3 between the source region 603S and the drain region 604D, and a channel CH4 between the source region 604S and the drain region 603D. The isolation component 605 may be embedded in the semiconductive substrate 601.

In detail, the isolation component 605 may be spaced apart from the channel CH1 between the source region 603S and the drain region 603D. The isolation component 605 may be spaced apart from the channel CH2 between the source region 604S and the drain region 604D. In other words, the formation of the isolation component 605 may not block the channel CH1 between the source region 603S and the drain region 603D and may not block the channel CH2 between the source region 604S and the drain region 604D.

Further, the isolation component 605 may be spaced apart from the channel CH3 between the source region 603S and the drain region 604D. The isolation component 605 may be spaced apart from the channel CH4 between the source region 604S and the drain region 603D. In other words, the formation of the isolation component 605 may not block the channel CH3 between the source region 603S and the drain region 604D and may not block the channel CH4 between the source region 604S and the drain region 603D.

Figure 6B:
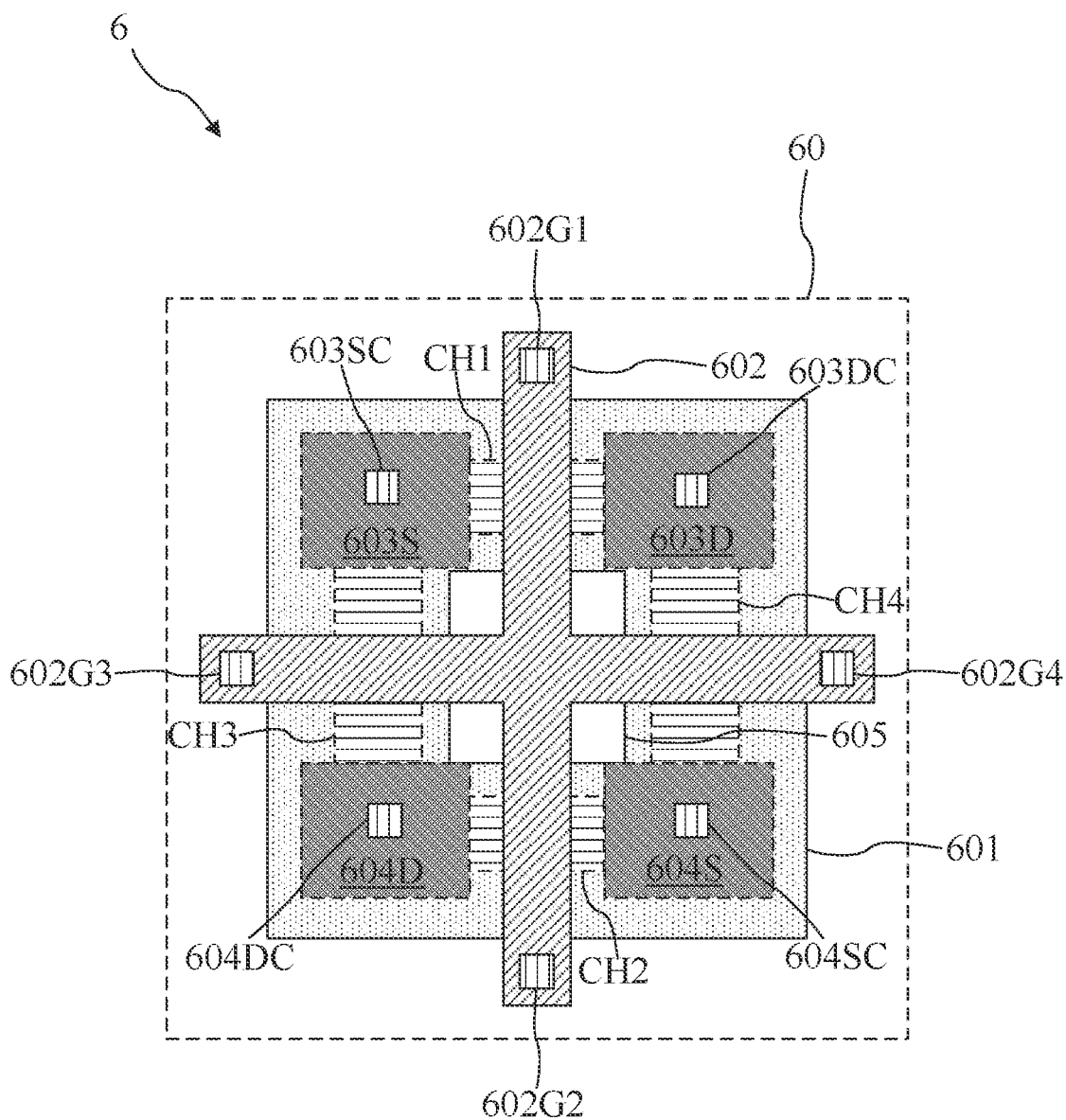

FIG. 6B is a top view of the semiconductor structure 6 in accordance with some embodiments of the present disclosure. The source region 603S has a source contact 603SC. The drain region 603D has a drain contact 603DC. The source region 604S has a 604SC. The drain region 604D has a drain contact 604DC. The source contacts 603SC, 604SC and the drain contacts 603DC, 604DC may protrude from the surface of the semiconductive substrate 601. The gate 602 has a first pair of gate contacts 602G1 and 602G2, and a second pair of gate contacts 602G3 and 602G4. The first pair of gate contacts 602G1 and 602G2 may protrude from a surface of the gate 602, and be used for being applied voltage to active the channels CH1 and CH2. The second pair of gate contacts 602G3 and 602G4 may protrude from the surface the surface of the gate 602, and be used for being applied voltage to active the channels CH3 and CH4.

Figure 6C:
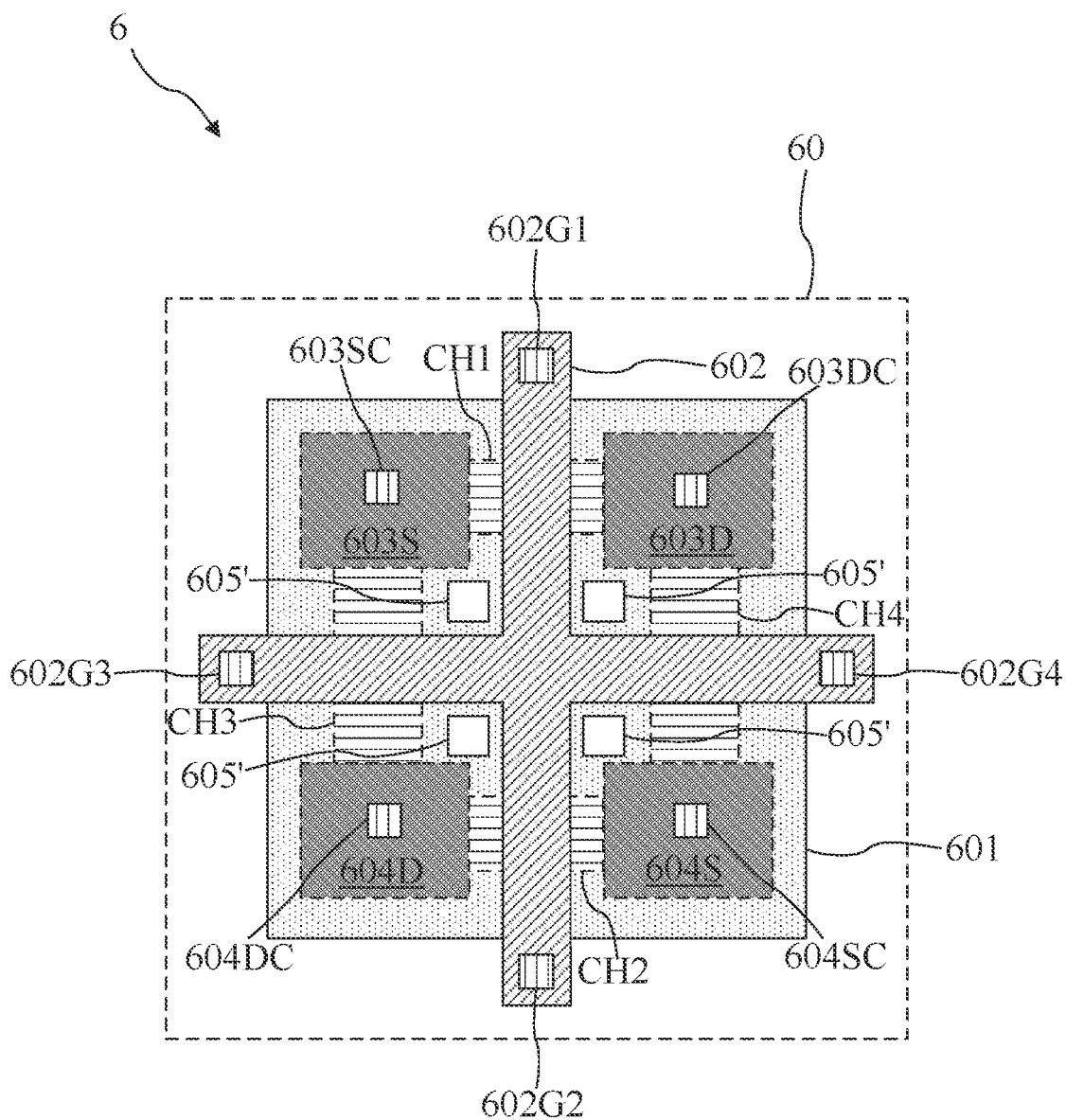

FIG. 6C is a top view of the semiconductor structure 6 in accordance with some embodiments of the present disclosure. As shown in FIG. 6C, the transistor 60 includes a plurality of isolation components 605'. Each of the plurality of isolation components 605' may be spaced apart from the channel CH1 between the source region 603S and the drain region 603D. Each of the plurality of the isolation components 605' may be spaced apart from the channel CH2 between the source region 604S and the drain region 604D. Each of the plurality of the isolation components 605' may be spaced apart from the channel CH3 between the source region 603S and the drain region 604D. Each of the plurality of the isolation components 605' may be spaced apart from the channel CH4 between the source region 604S and the drain region 603D. In other words, the formations of the isolation components 605' may not block the channels CH1 to CH4 between the source regions 603S, 604S and the drain regions 603D, 604D.

Figure 7:
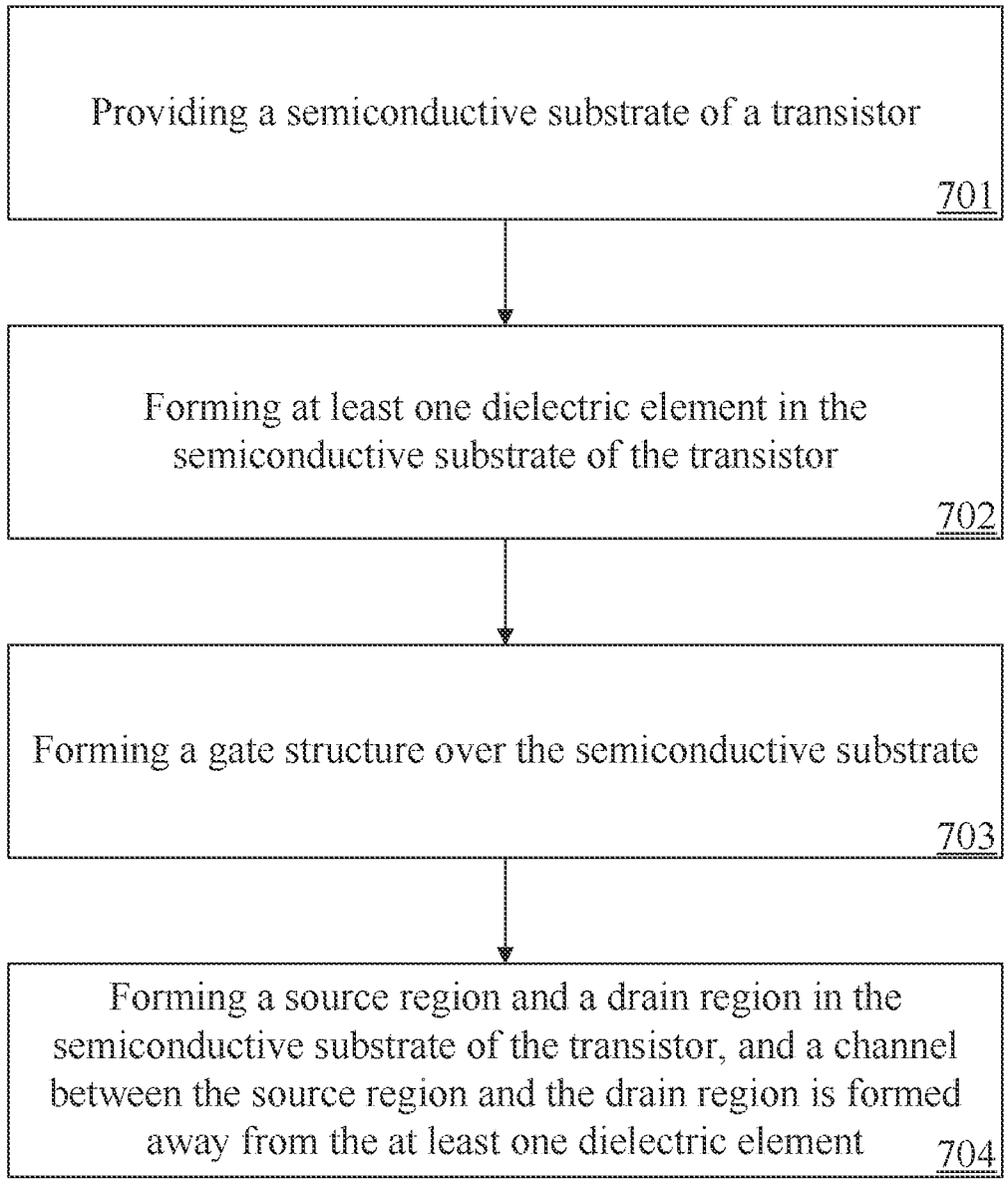
FIG. 7 is a flowchart illustrating a method for manufacturing a semiconductor structure in accordance with some embodiments of the present disclosure.

Some embodiments of the present disclosure provide a method for manufacturing a semiconductor structure as shown in FIG. 7. The method includes: operation 701, in which a semiconductive substrate of a transistor is provided; operation 702, in which at least one dielectric element is formed in the semiconductive substrate of the transistor; operation 703, in which a gate structure is formed over the semiconductive substrate; and operation 704, in which a source region and a drain region are formed in the semiconductive substrate of the transistor, wherein the gate structure is between the source region and the drain region, and a channel between the source region and the drain region is formed away from the at least one dielectric element.

In some embodiments, operation 702, in which the at least one dielectric element is formed, includes two sub-operations: (i) forming at least one trench in the semiconductive substrate of the transistor; and (ii) filling the at least one trench with oxide material for forming the at least one dielectric element.

The above methods are illustrated in more detail in the following description by providing various embodiments. However, the description meant to be illustrative only, and is not intended to limit the present disclosure.

Figure 8A:
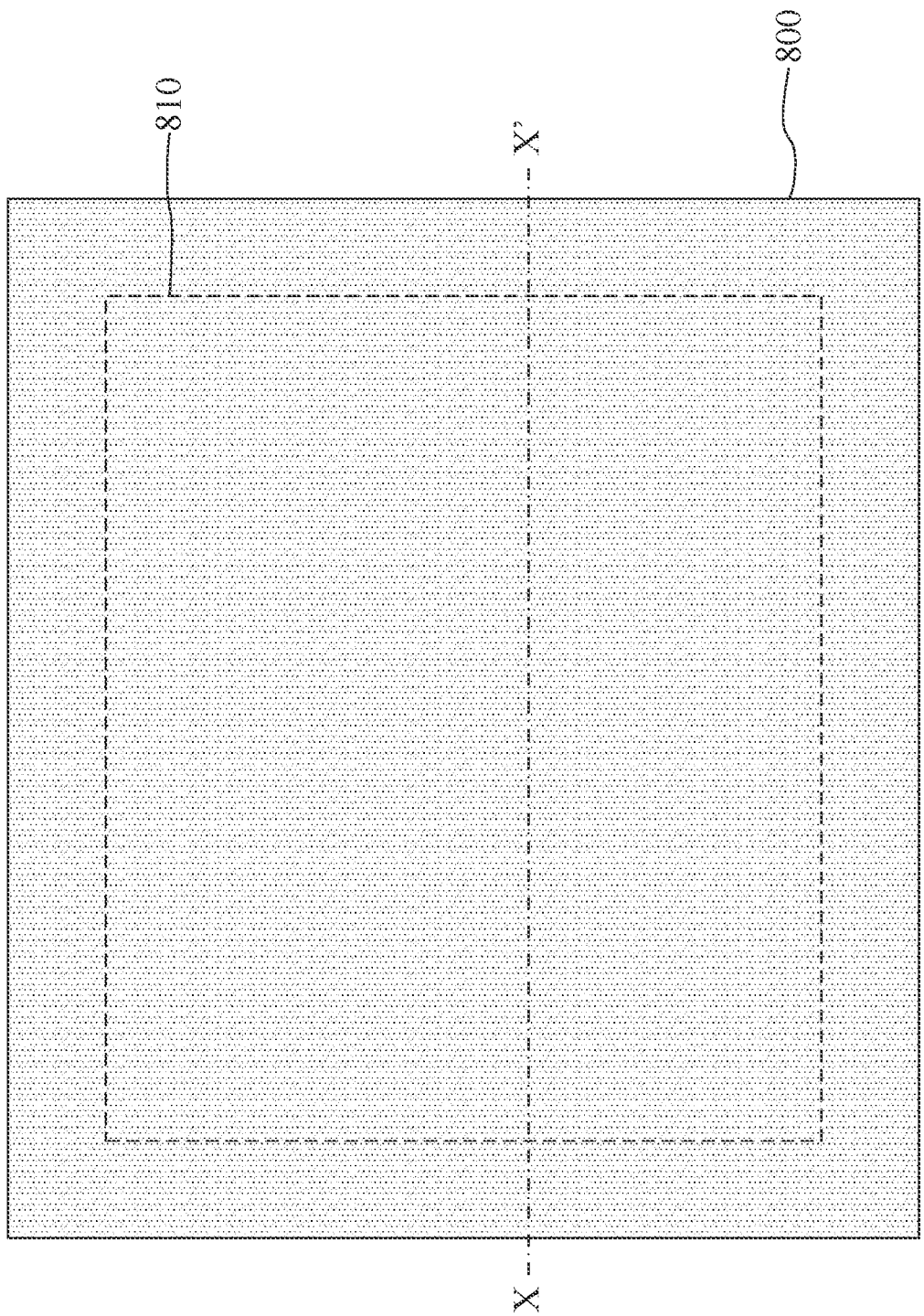
Figure 8B:
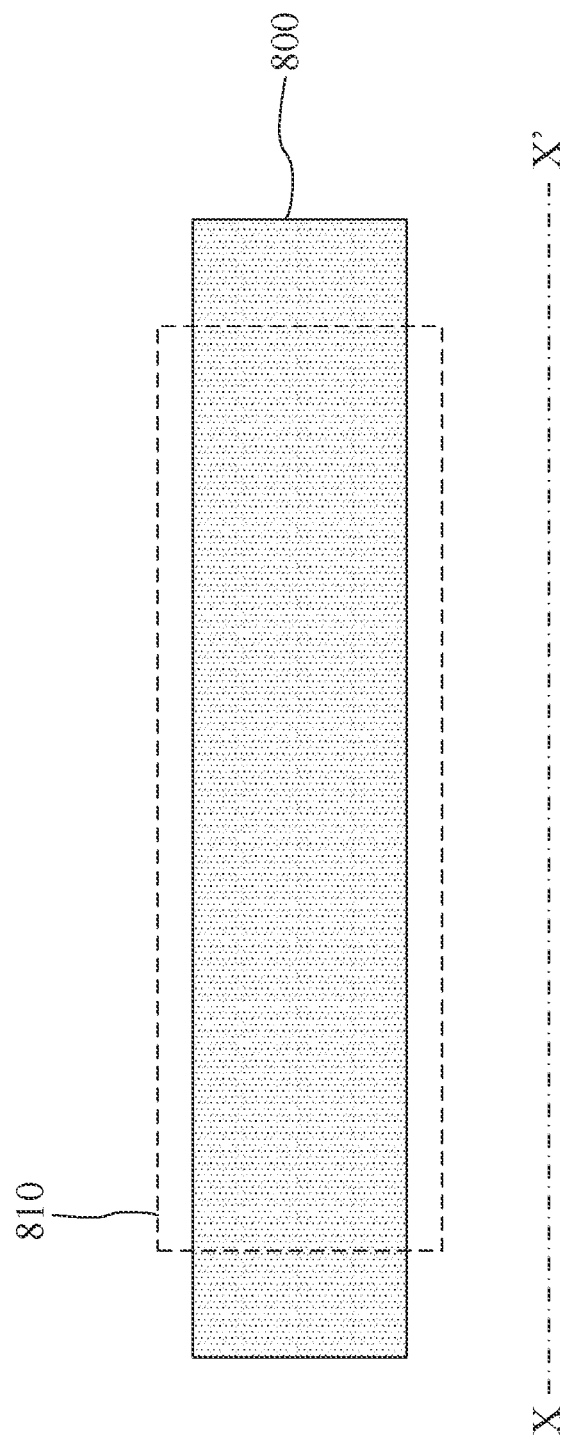

To illustrate operation 701 of the method, FIGS. 8A and 8B are provided in accordance with some embodiments of the present disclosure. As shown in FIG. 8A, a semiconductive substrate 800 is provided. One unit of transistor 810 may be defined in the semiconductive substrate 800. FIG. 8B is a cross-section of the semiconductive substrate 800 in FIG. 8A.

Figure 8C:
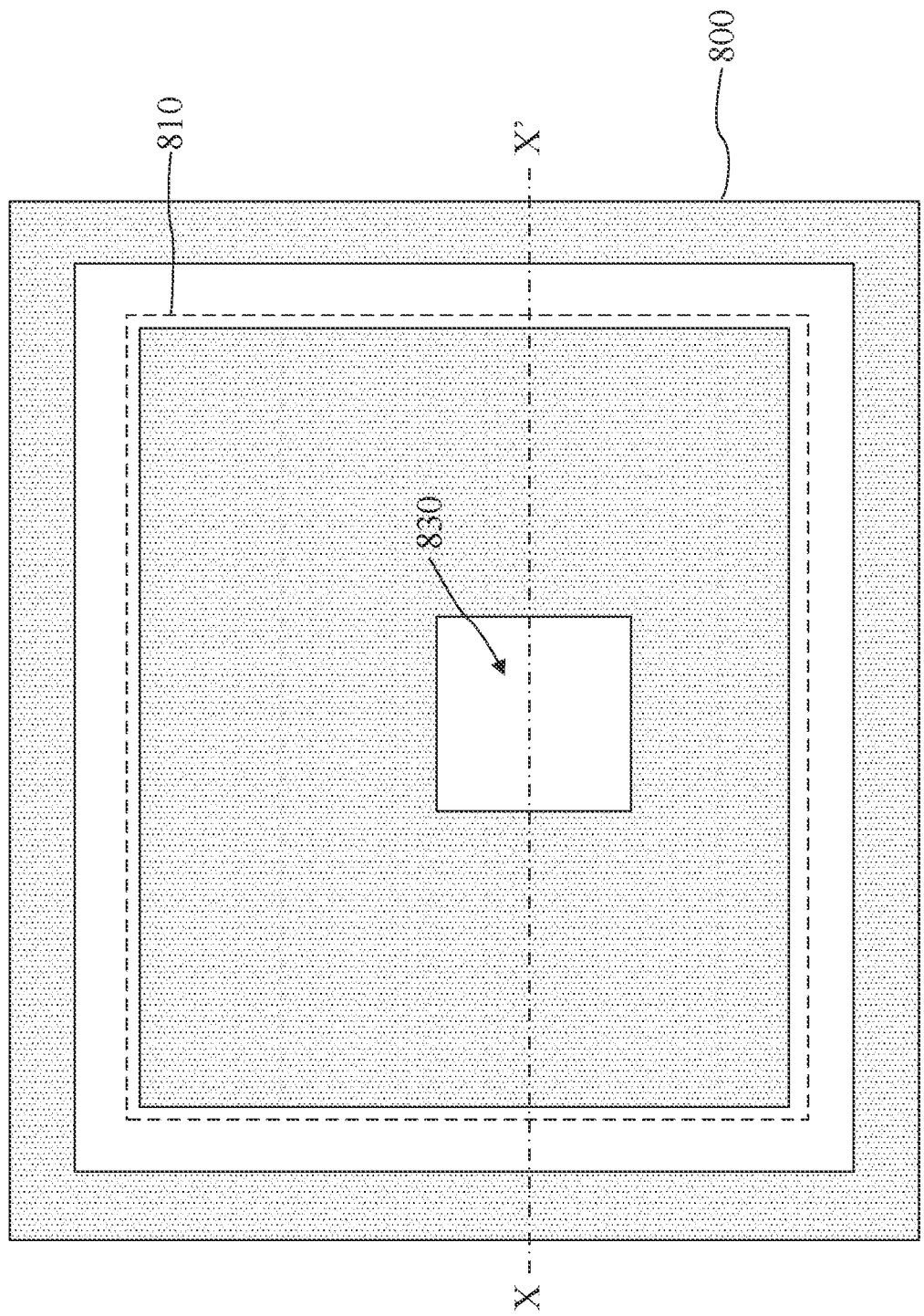
Figure 8D:
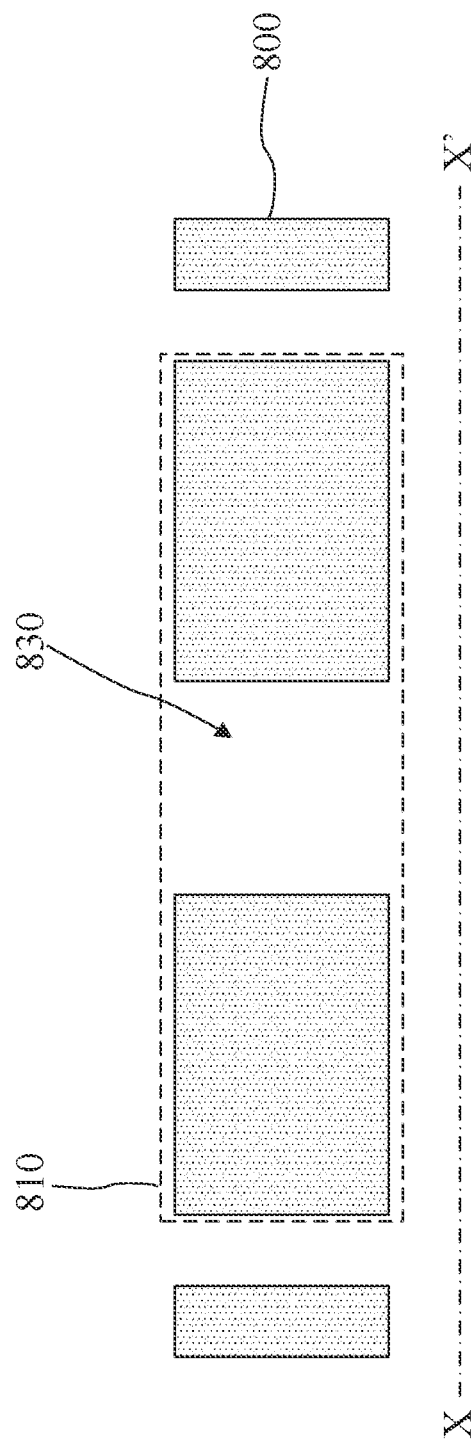

FIGS. 8C to 8F illustrate operation 702 of the method in accordance with some embodiments of the present disclosure. When operations of shallow trench isolation (STI) are performed for defining the transistor 810, the operations of STI are also performed for forming at least one dielectric element 820 in the semiconductive substrate 800 of the transistor 810. As shown in FIG. 8C, the semiconductive substrate 800 is etched for defining the transistor 810. At the same time, the semiconductive substrate 800 within the area of the transistor 810 is etched. In detail, at least one trench 830 is formed in the semiconductive substrate 800 of the transistor 810 while the semiconductive substrate 800 is etched for defining the transistor 810. FIG. 8D is a cross-section of the semiconductive substrate 800 in FIG. 8C.

Figure 8E:
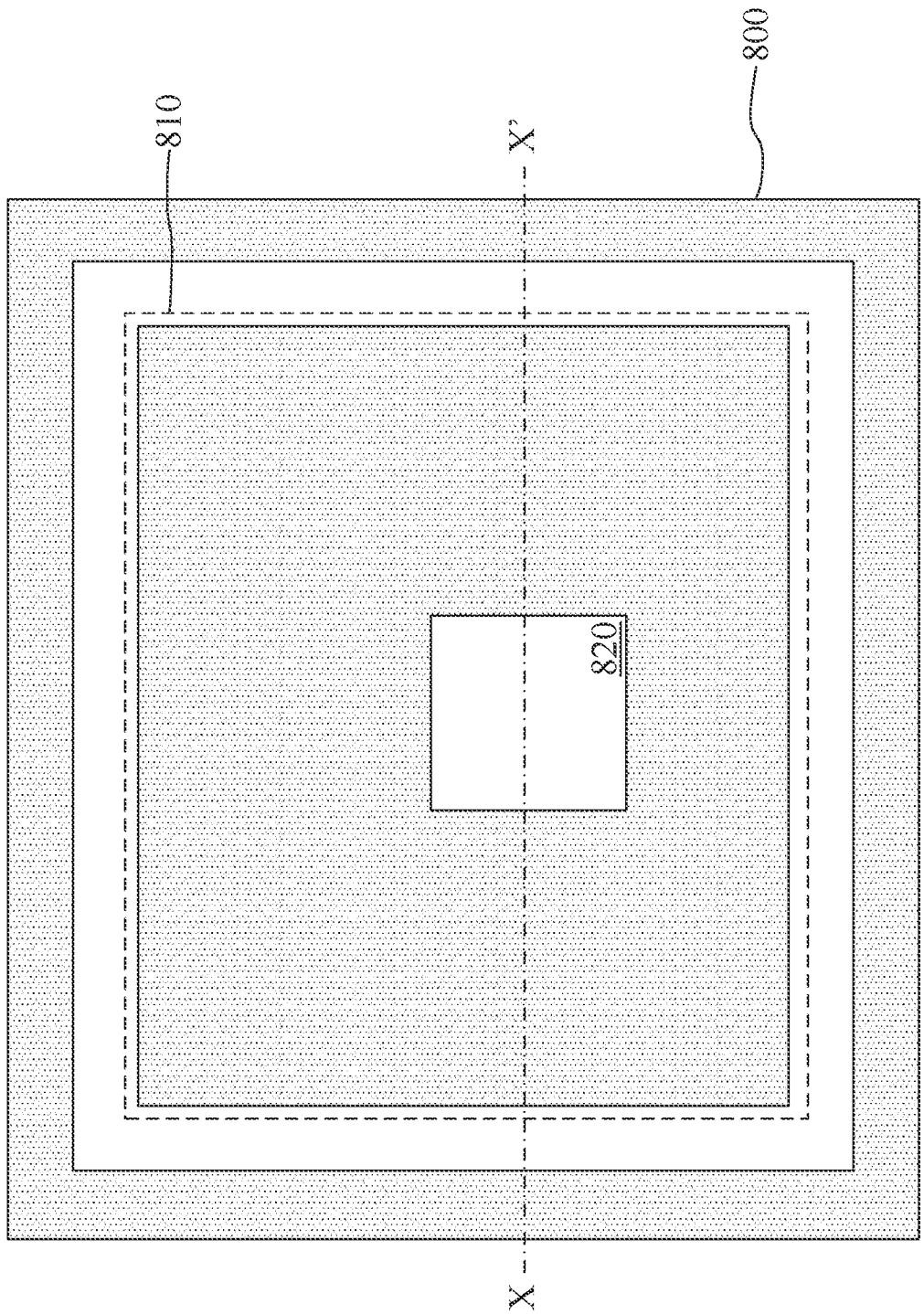
Figure 8F:
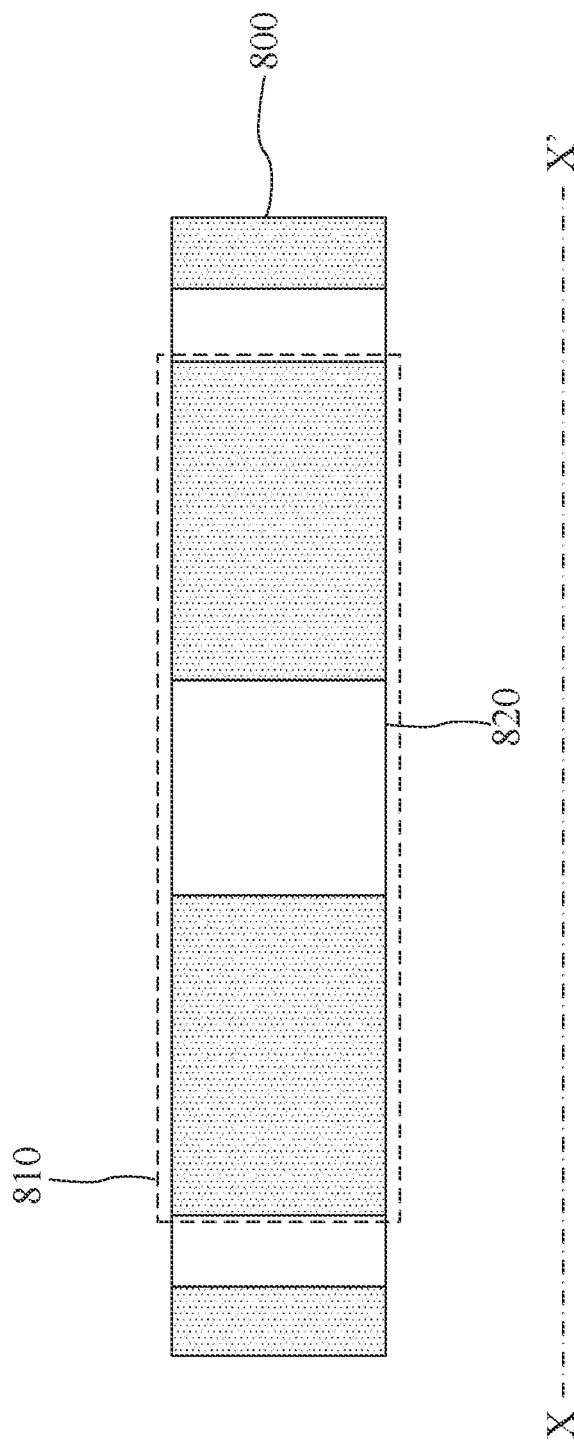

As shown in FIG. 8E, when the filling operation of STI is performed with oxide material, the at least one trench 830 in the semiconductive substrate 800 of the transistor 810 is filled with the oxide material at the same time. Accordingly, the at least one dielectric element 820 is formed in the semiconductive substrate 800 of the transistor 810. FIG. 8F is a cross-section of the semiconductive substrate 800 in FIG. 8E.

Figure 8G:
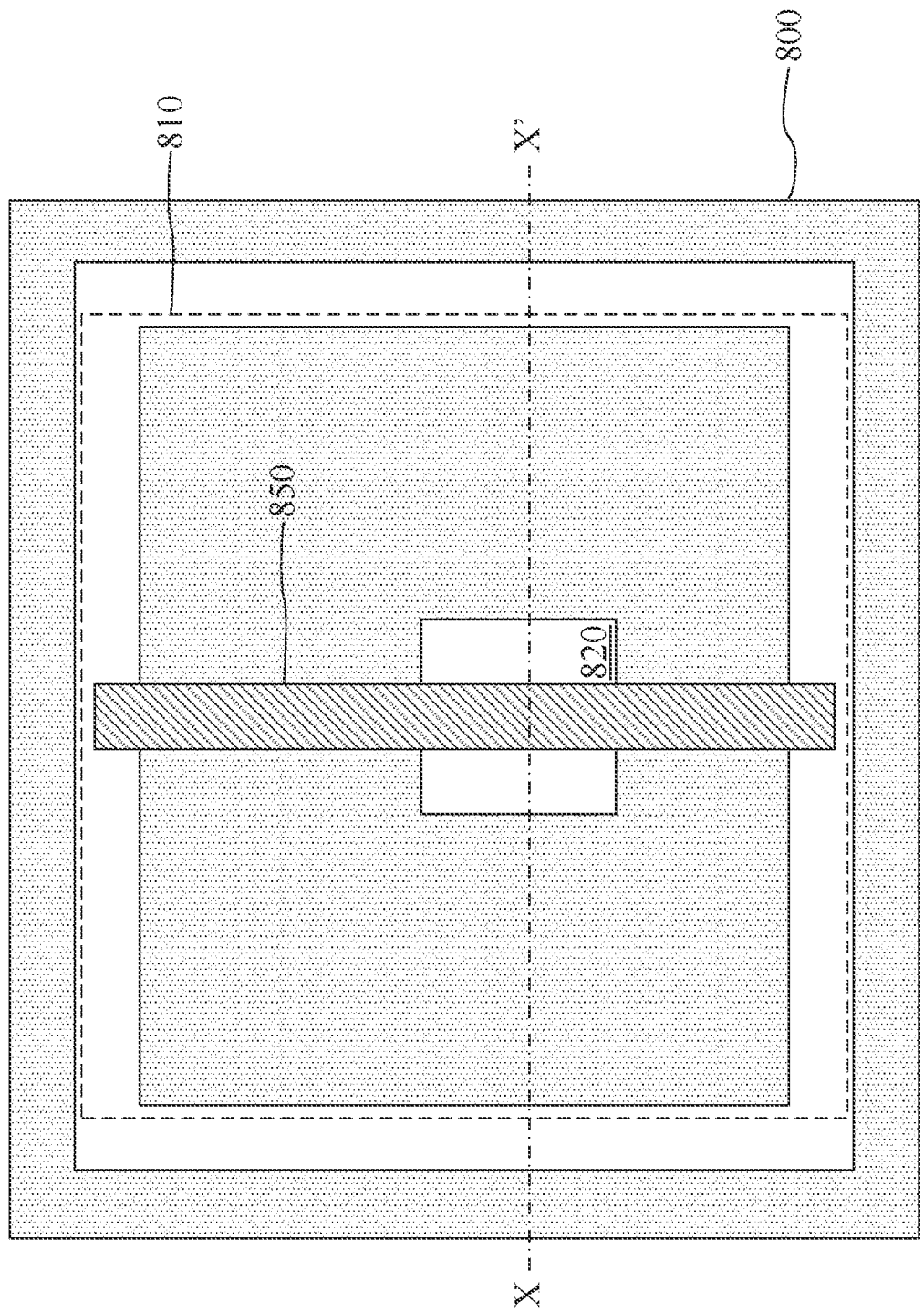
Figure 8H:
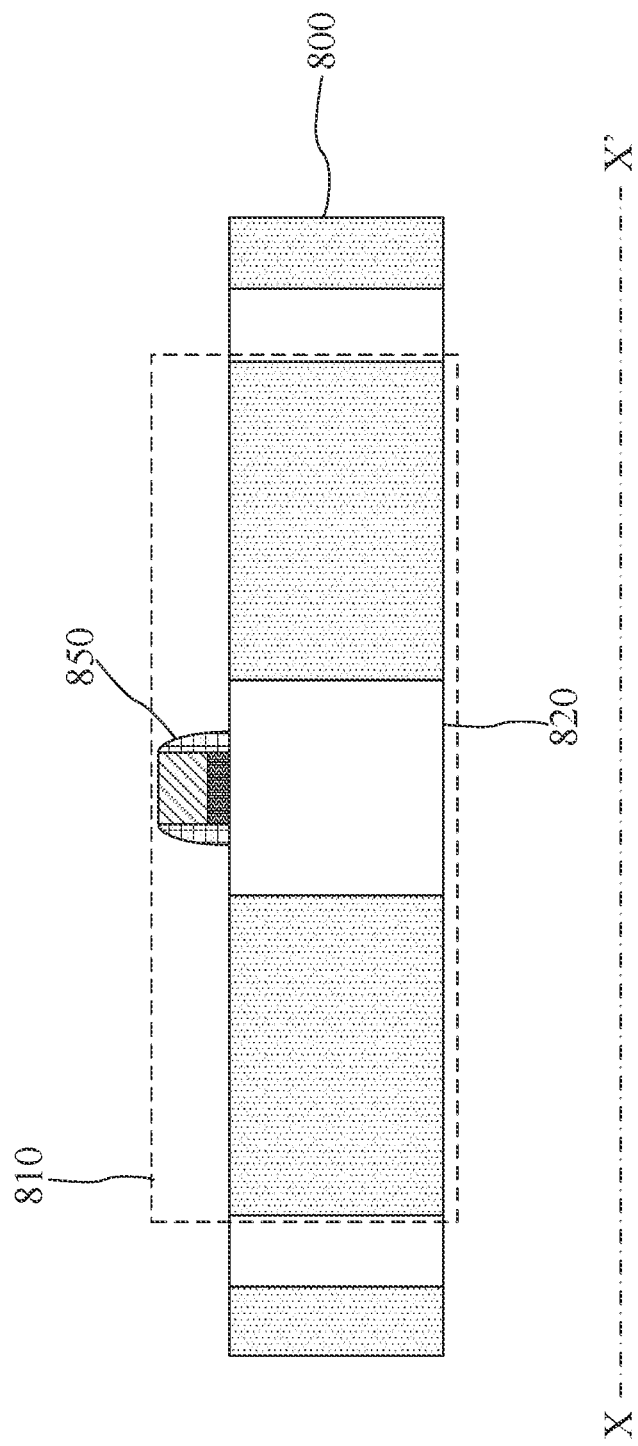
Figure 81:
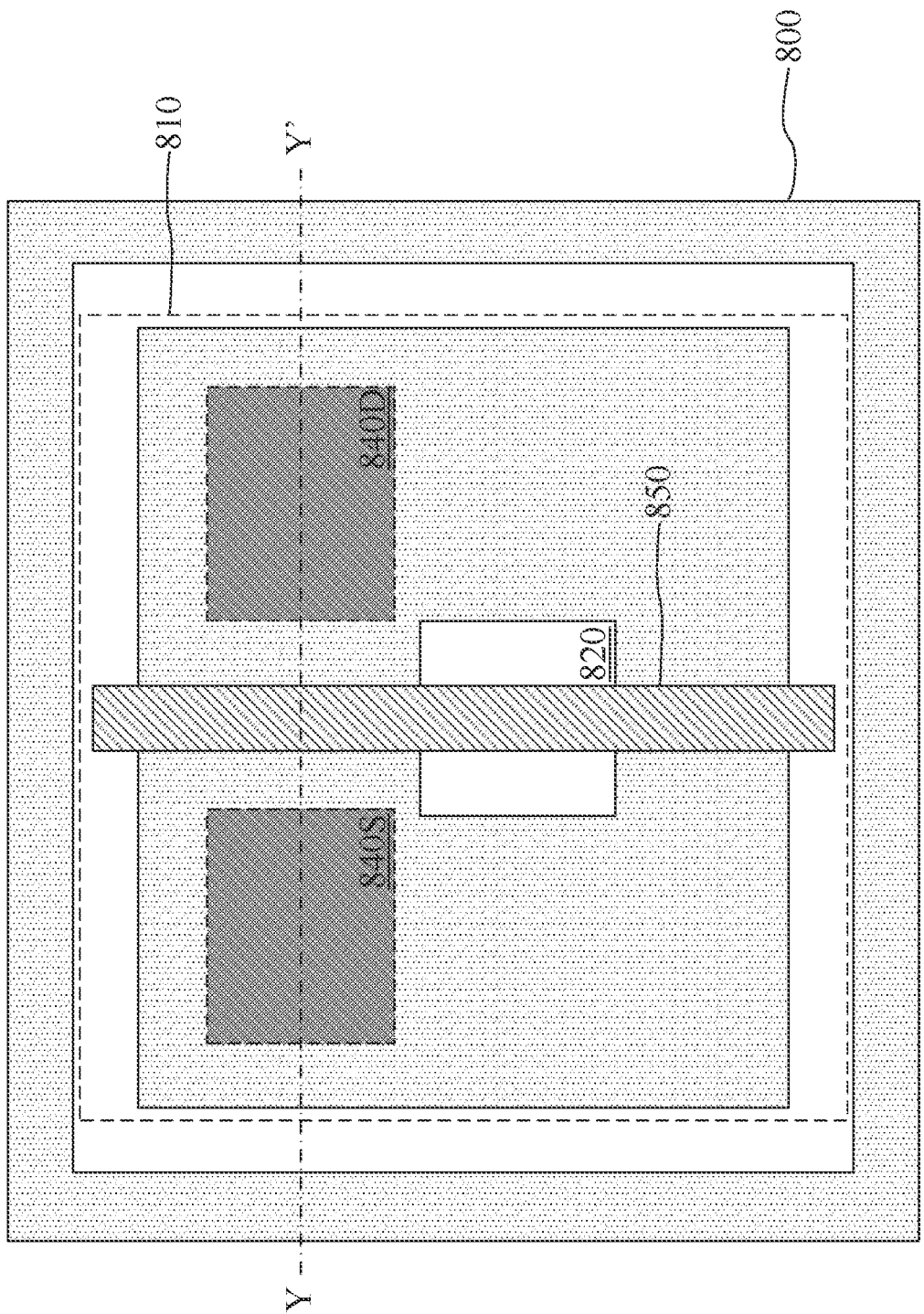
Figure 8J:
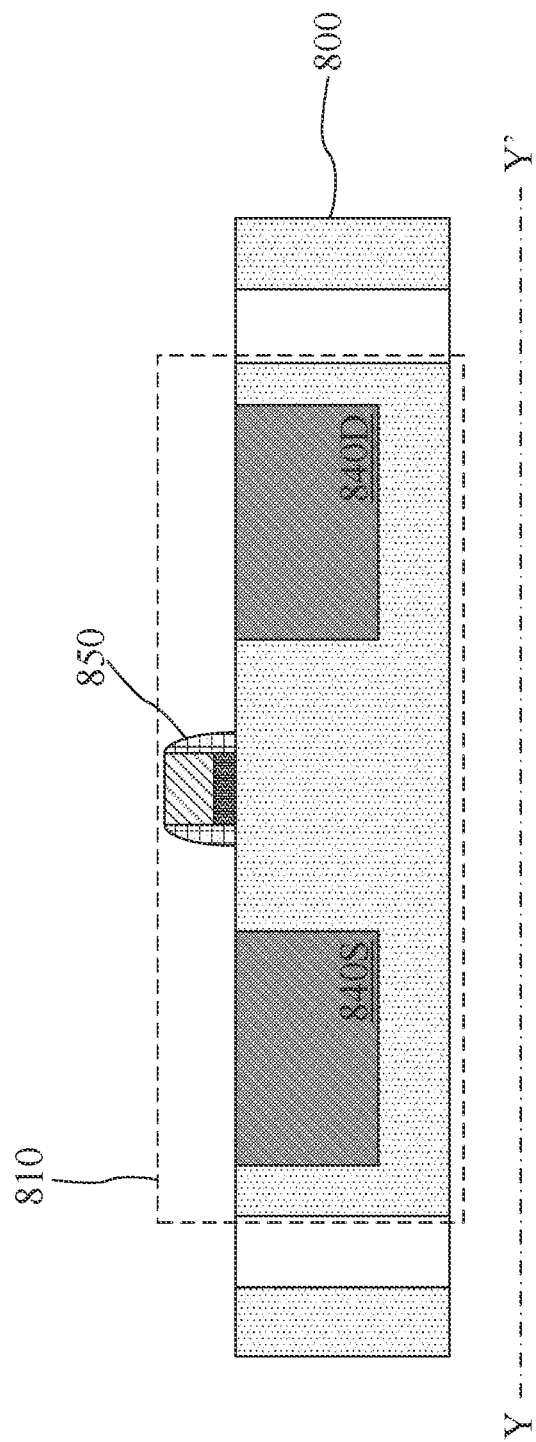

FIGS. 8G to 8H illustrate operation 703 of the method in accordance with some embodiments of the present disclosure. As shown in FIG. 8G, a gate structure 850 is formed over the semiconductive substrate 800. FIG. 8H is a cross-section of the semiconductive substrate 800 in FIG. 8G. FIGS. 8I to 8J illustrate operation 704 of the method in accordance with some embodiments of the present disclosure. As shown in FIG. 8I, a source region 840S is formed in the semiconductive substrate 800, and a drain region 840D is formed in the semiconductive substrate 800. In some embodiments, the gate structure 850 is between the source region 840S and the drain region 840D. A channel between the source region 840S and the drain region 840D is formed away from the at least one dielectric element 820. FIG. 8J is a cross-section of the semiconductive substrate 800 in FIG. 8I.

Figure 9A:
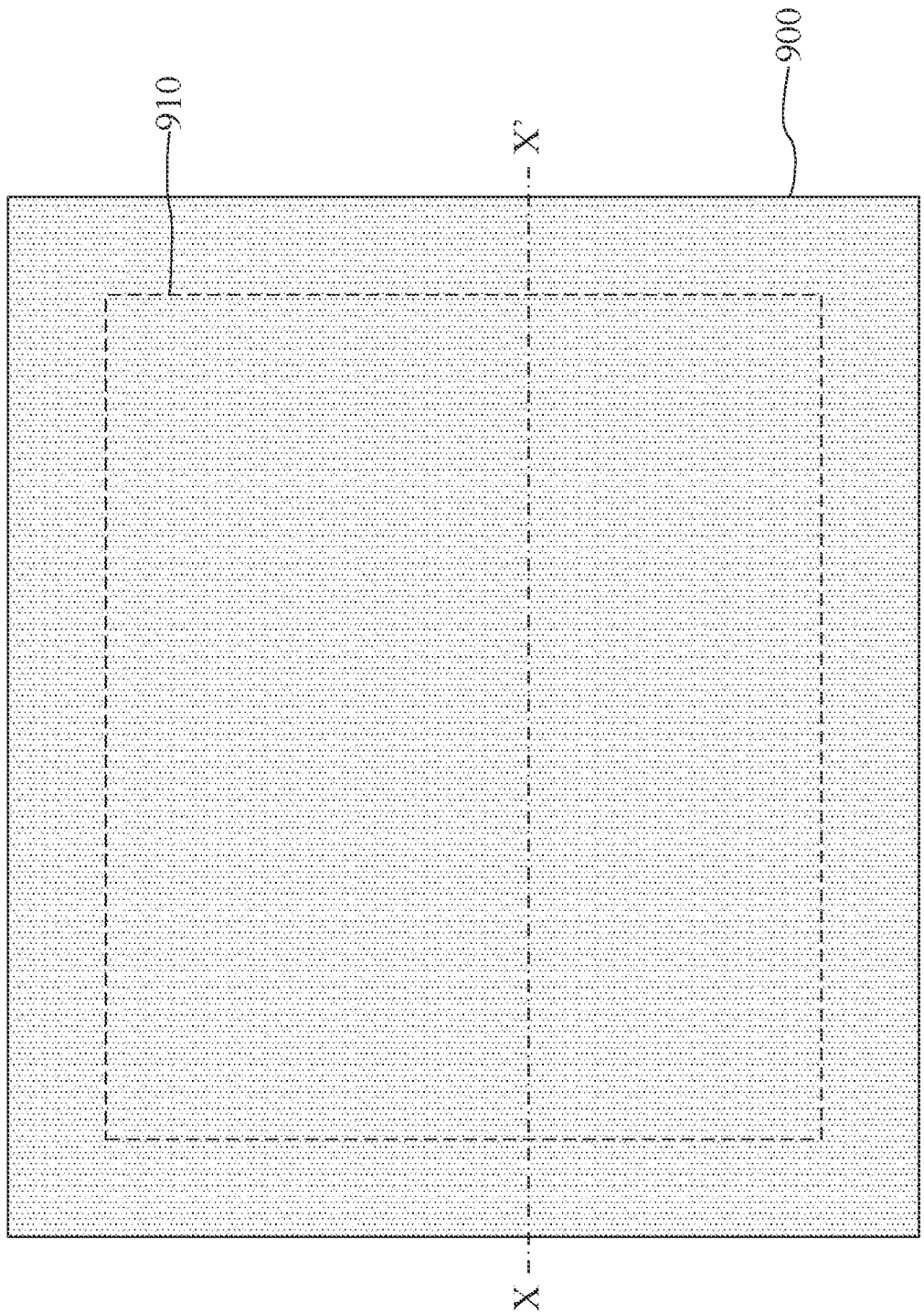
Figure 9B:
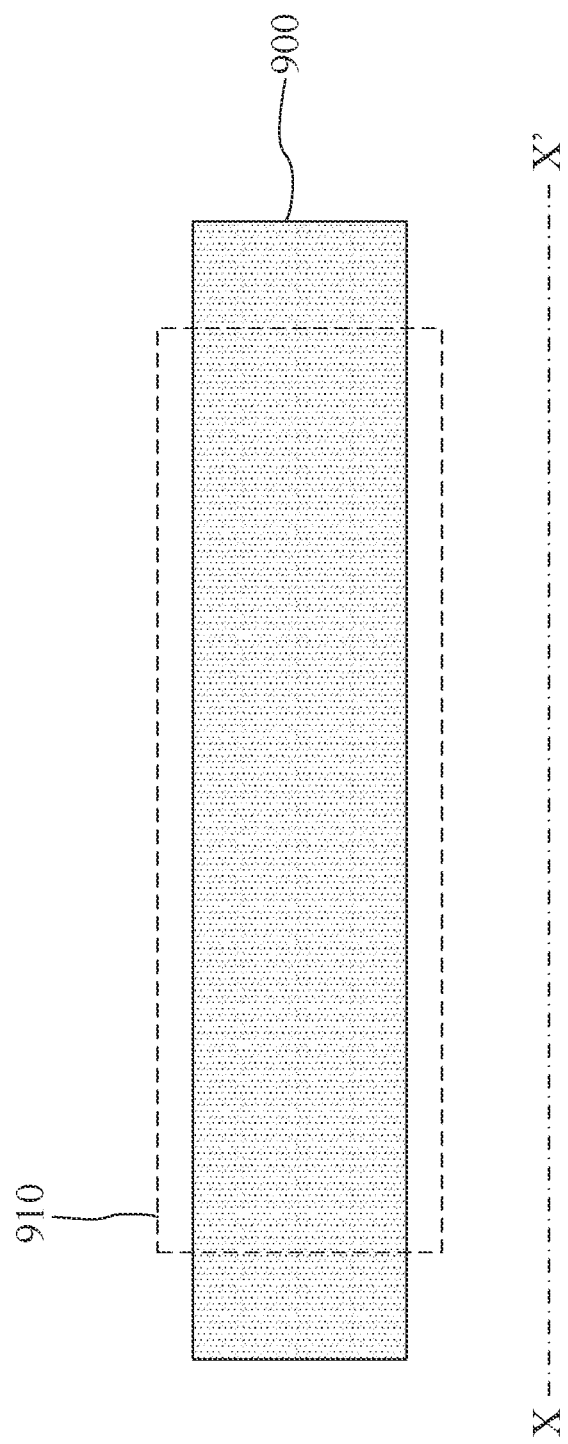

To illustrate operation 701 of the method, FIGS. 9A and 9B are provided in accordance with some embodiments of the present disclosure. As shown in FIG. 9A, a semiconductive substrate 900 is provided. One unit of transistor 910 may be defined in the semiconductive substrate 900. FIG. 9B is a cross-section of the semiconductive substrate 900 in FIG. 9A.

Figure 9C:
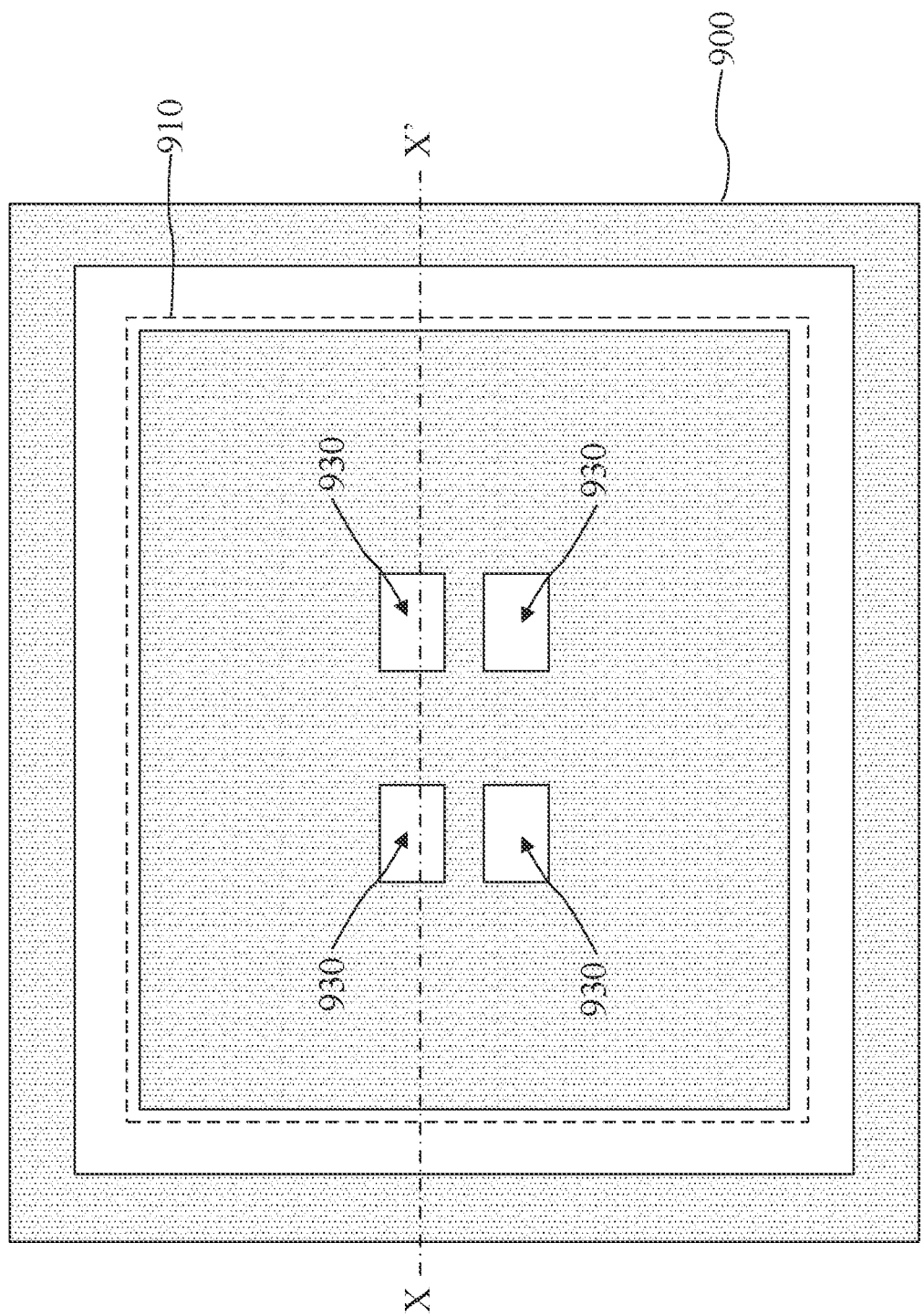
Figure 9D:
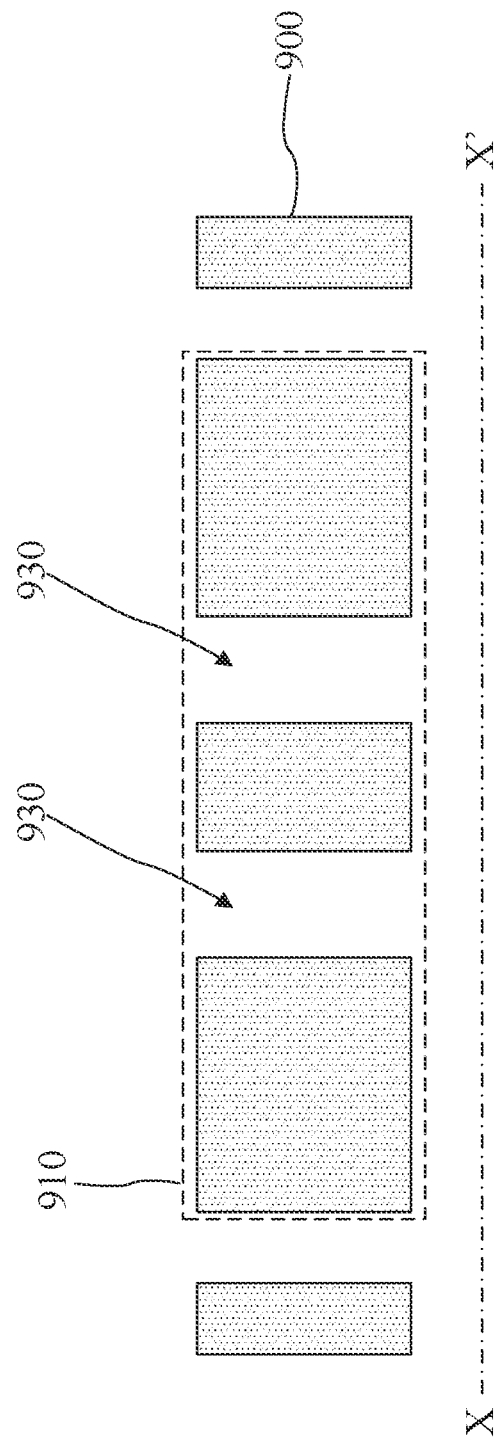

FIGS. 9C to 9F illustrate operation 702 of the method in accordance with some embodiments of the present disclosure. When operations of STI are performed for defining the transistor 910, the operations of STI are also performed for forming plurality of isolation components 920 in the semiconductive substrate 900 of the transistor 910. As shown in FIG. 9C, the semiconductive substrate 900 is etched for defining the transistor 910. At the same time, the semiconductive substrate 900 within the area of the transistor 910 is etched. In detail, a plurality of trenches 930 are formed in the semiconductive substrate 900 of the transistor 910 while the semiconductive substrate 900 is etched for defining the transistor 910. FIG. 9D is a cross-section of the semiconductive substrate 900 in FIG. 9C.

Figure 9E:
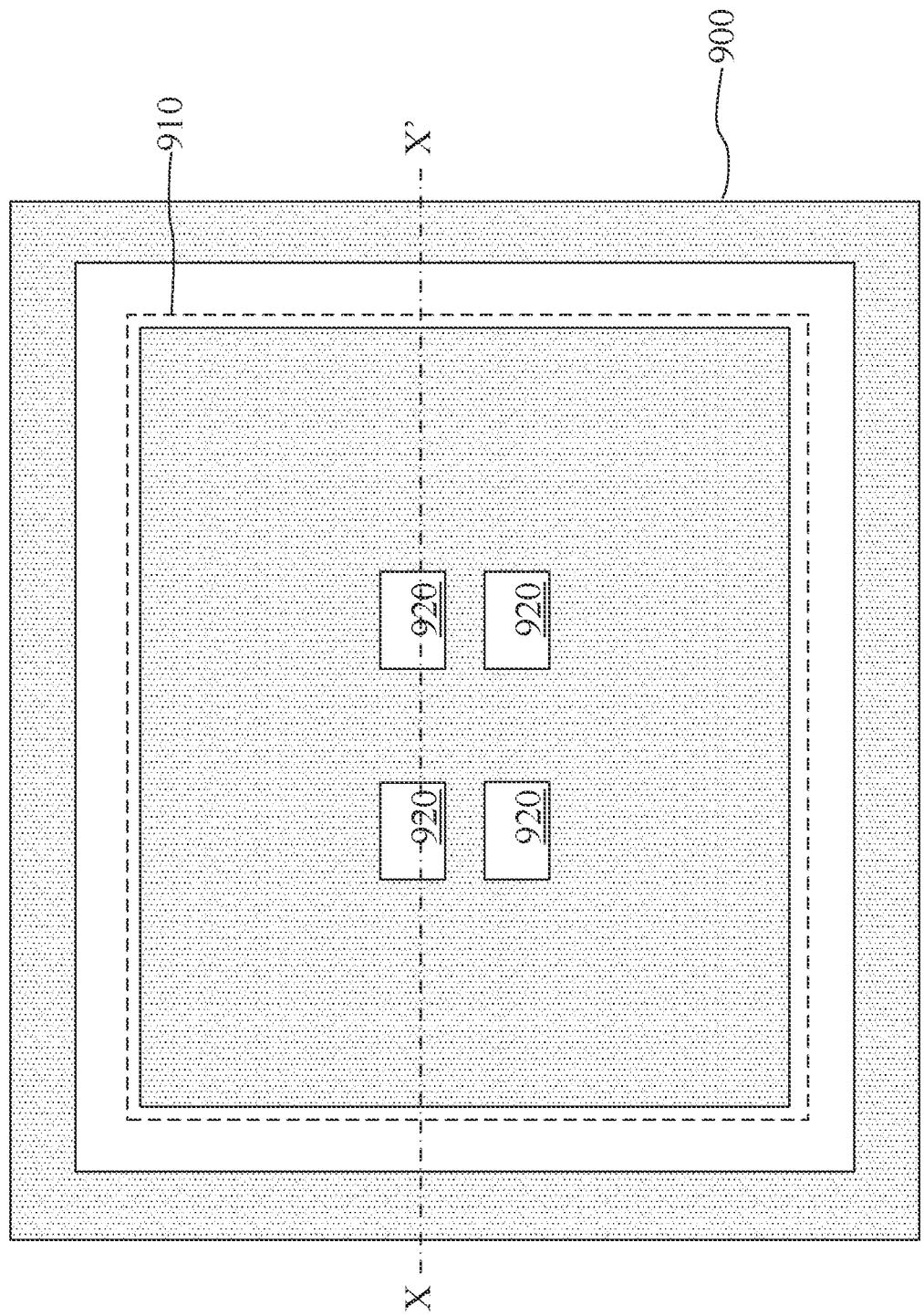
Figure 9F:
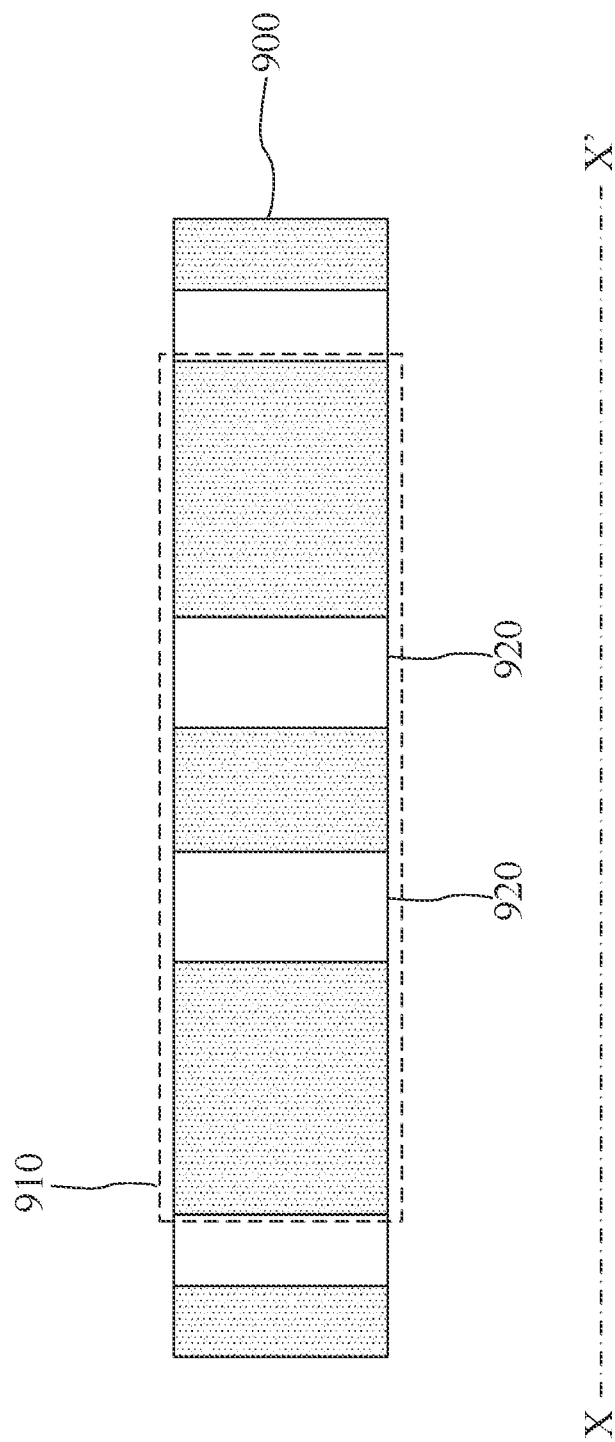

As shown in FIG. 9E, while the filling operation of is performed with oxide material, the trenches 930 in the semiconductive substrate 900 of the transistor 910 is filled with the oxide material at the same time. Accordingly, the isolation components 920 are formed in the semiconductive substrate 900 of the transistor 910. FIG. 9F is a cross-section of the semiconductive substrate 900 in FIG. 9E.

Figure 9G:
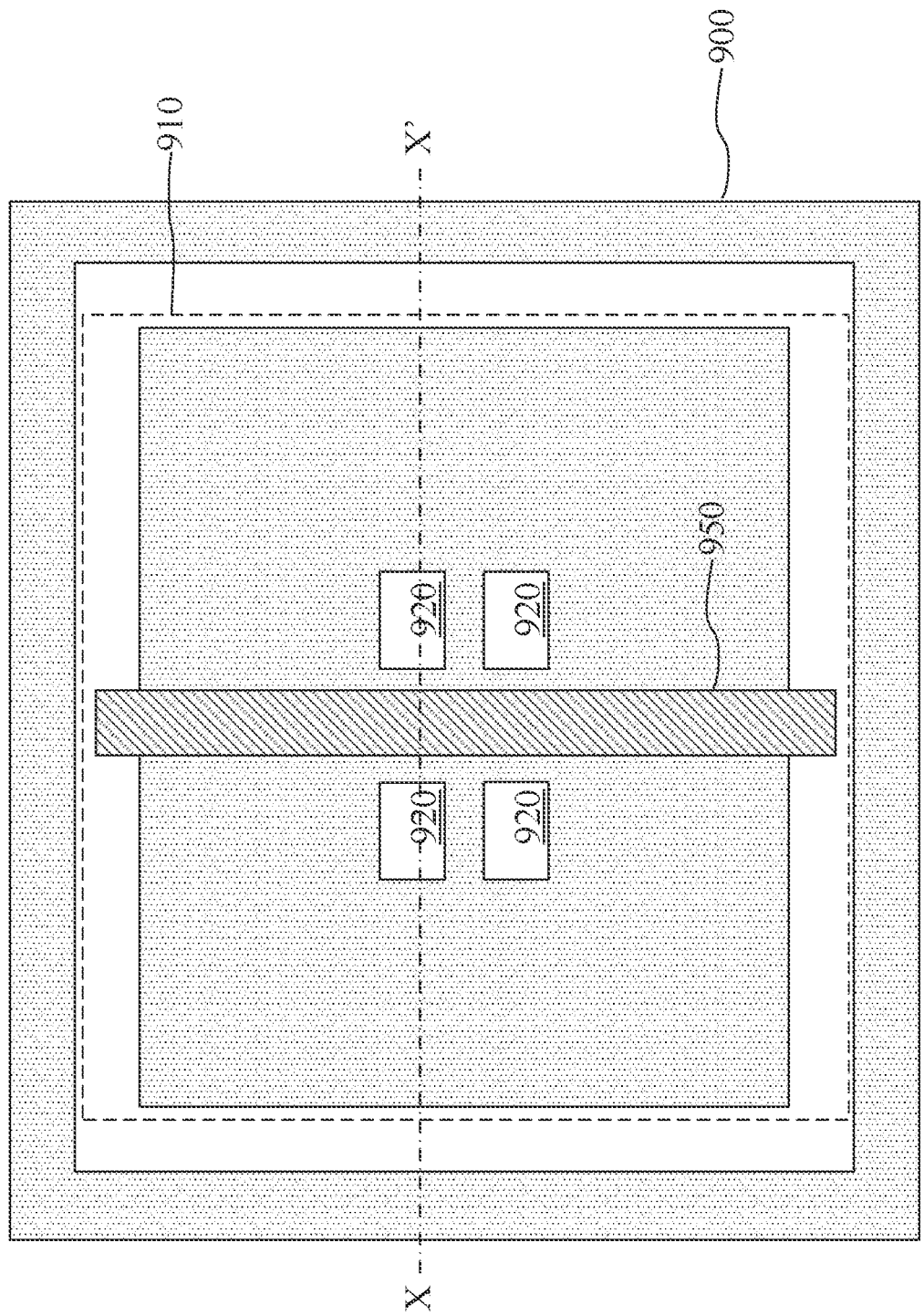
Figure 9H:
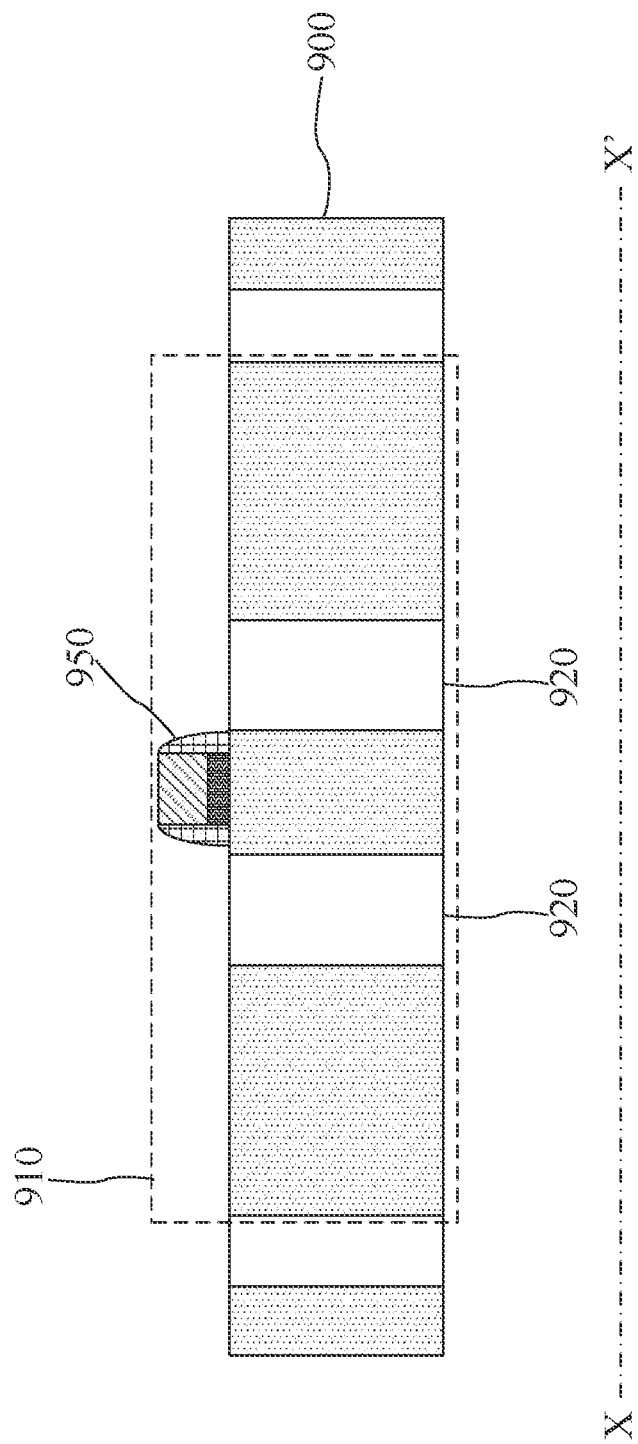
Figure 9I:
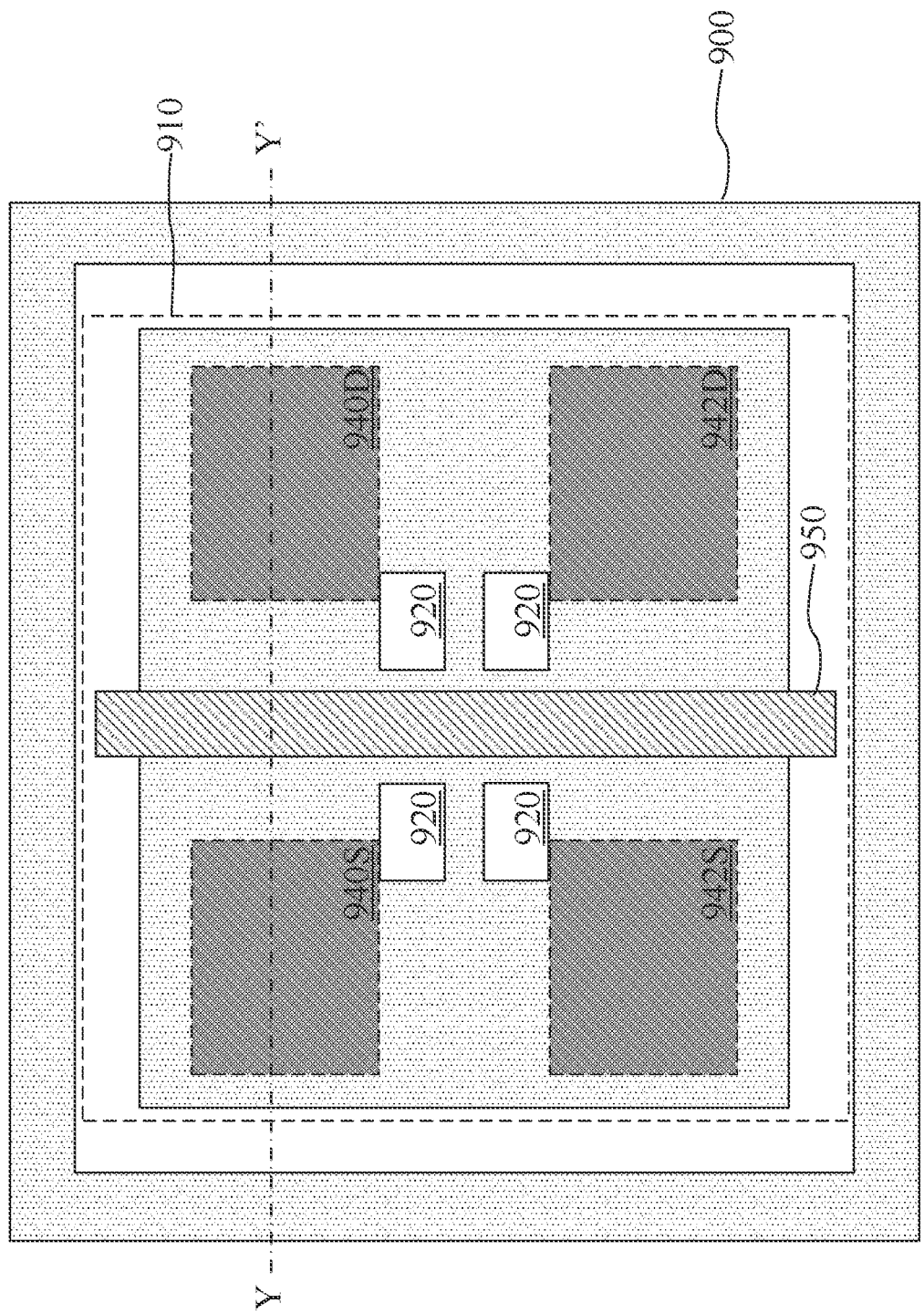
Figure 9J:
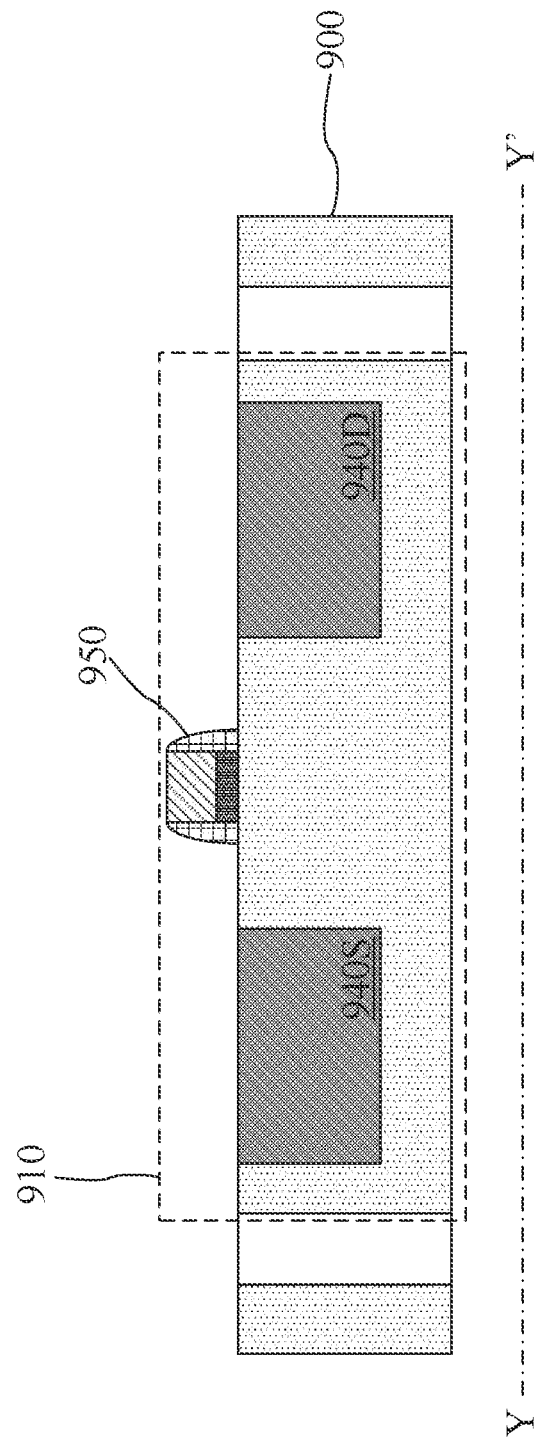

FIGS. 9G to 9H illustrate operation 703 of the method in accordance with some embodiments of the present disclosure. As shown in FIG. 9G, a gate structure 950 is formed over the semiconductive substrate 900. FIG. 9H is a cross-section of the semiconductive substrate 900 in FIG. 9G. FIGS. 9I to 9J illustrate operation 704 of the method in accordance with some embodiments of the present disclosure. As shown in FIG. 9I, source regions 940S and 942S are formed in the semiconductive substrate 900, and drain regions 940D and 942D are formed in the semiconductive substrate 900. In some embodiments, the gate structure 950 is between the source region 940S and the drain region 940D, and is between the source region 940S and the drain region 940D. A channel between the source region 940S and the drain region 940D is formed away from the isolation components 920. A channel between the source region 942S and the drain region 942D is formed away from the isolation components 920. FIG. 9J is a cross-section of the semiconductive substrate 900 in FIG. 9I.

Figure 9L:
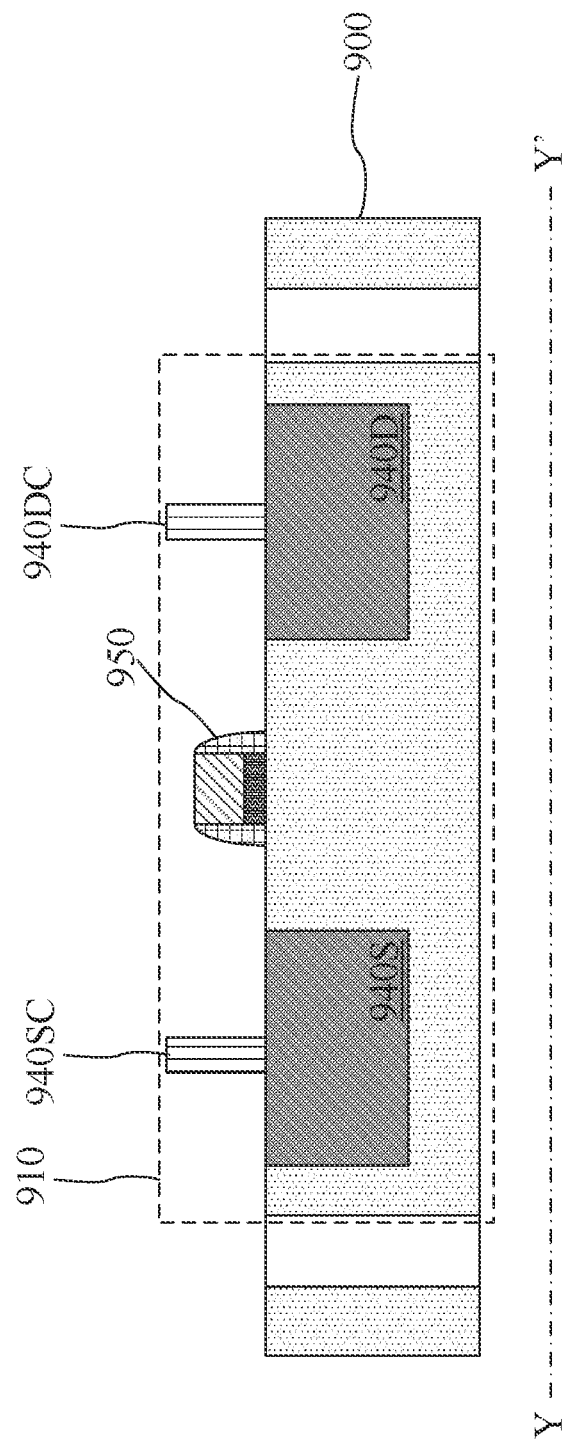
Figure 9M:
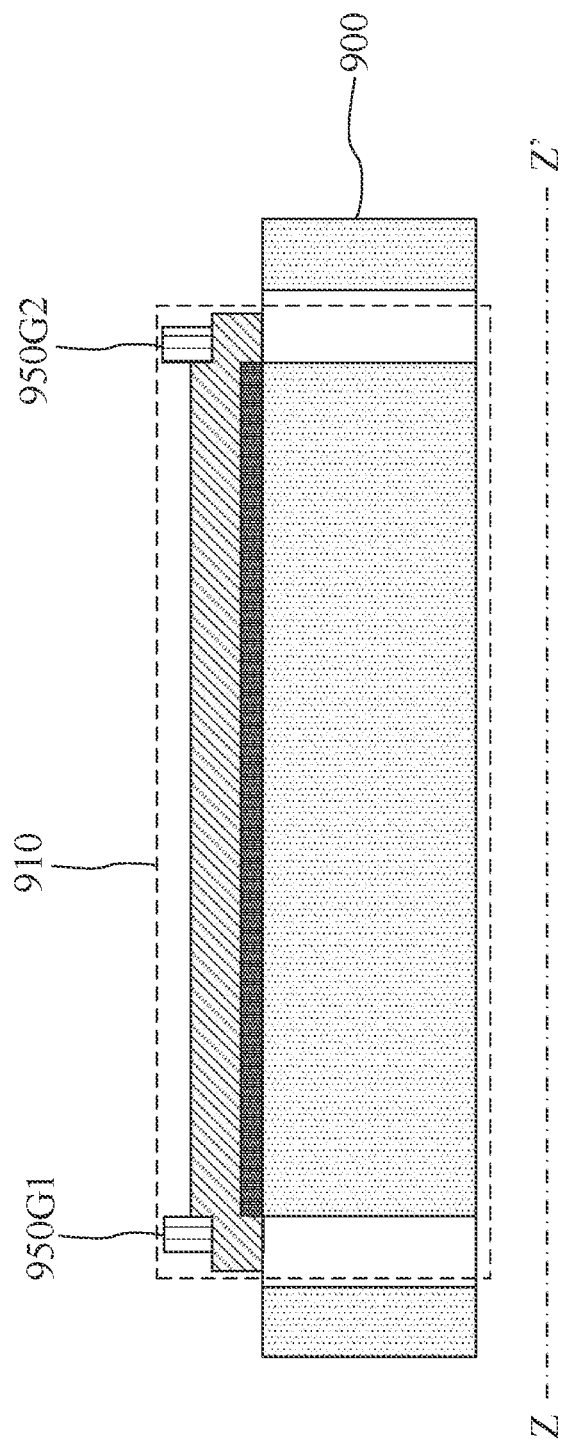

In some embodiments, contacts for the source regions, the drain regions and the gate structure may be formed. FIGS. 9K to 9M illustrate the method in accordance with some embodiments of the present disclosure. As shown in FIG. 9K, a source contact 940SC is formed on the source region 940S. A source contact 942SC is formed on the source region 942S. A drain contact 940DC is formed on the drain region 940D. A drain contact 942DC is formed on the drain region 942D. Further, gate contacts 950G1 and 950G2 are formed on a surface of the gate structure 950. FIGS. 9L and 9M are cross-sections of the semiconductive substrate 900 in FIG. 9K.

Figure 10A:
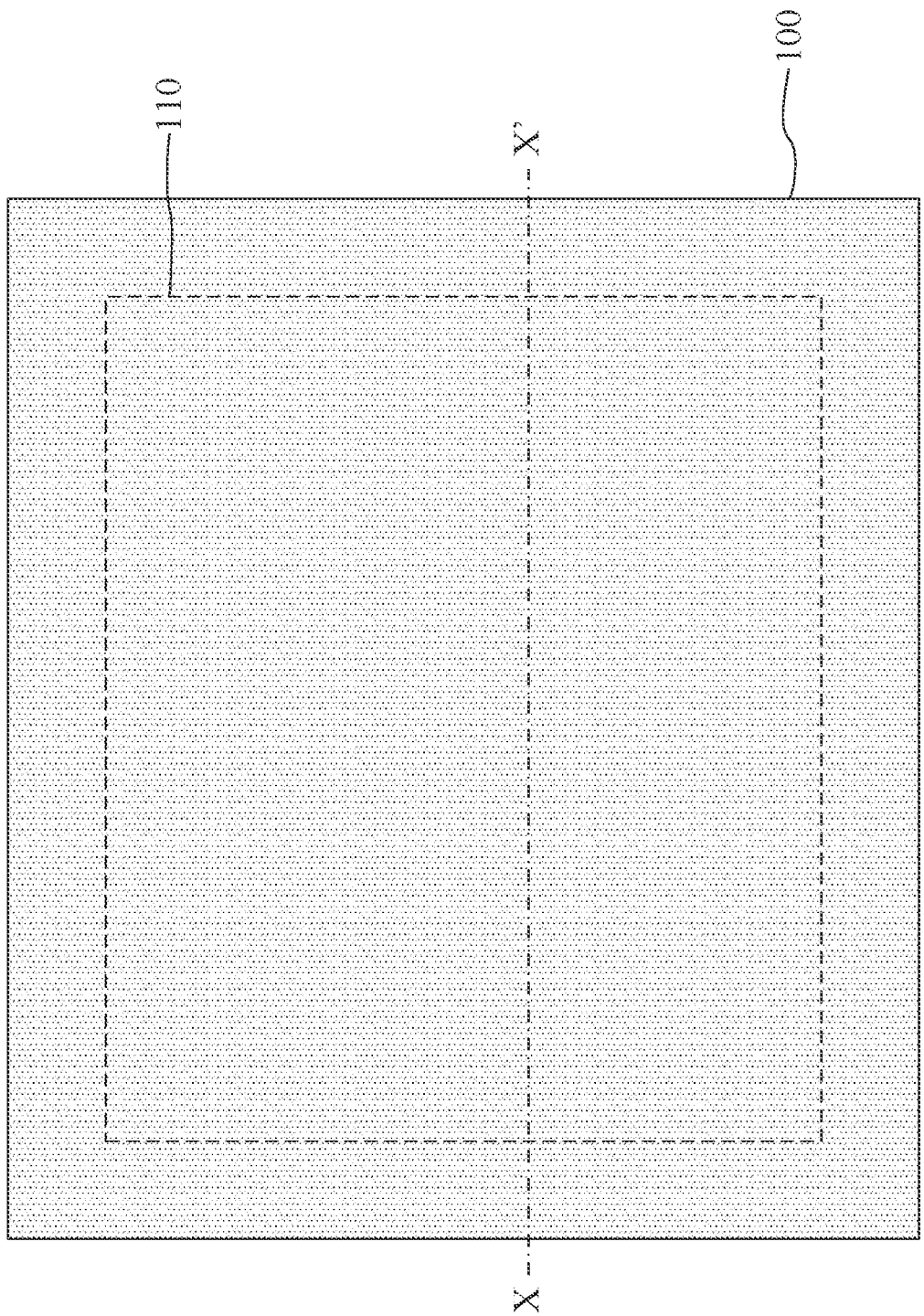
Figure 10B:
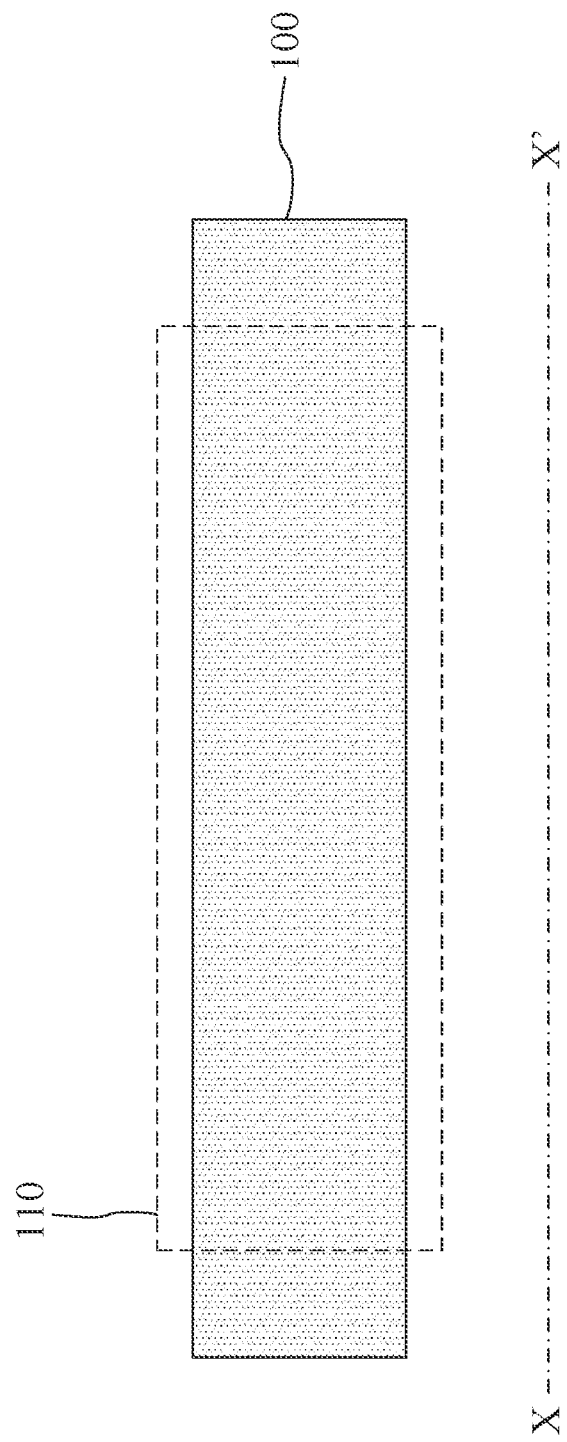

To illustrate operation 701 of the method, FIGS. 10A and 10B are provided in accordance with some embodiments of the present disclosure. As shown in FIG. 10A, a semiconductive substrate 100 is provided. One unit of transistor 110 may be defined in the semiconductive substrate 100. FIG. 9B is a cross-section of the semiconductive substrate 100 in FIG. 10A.

Figure 10C:
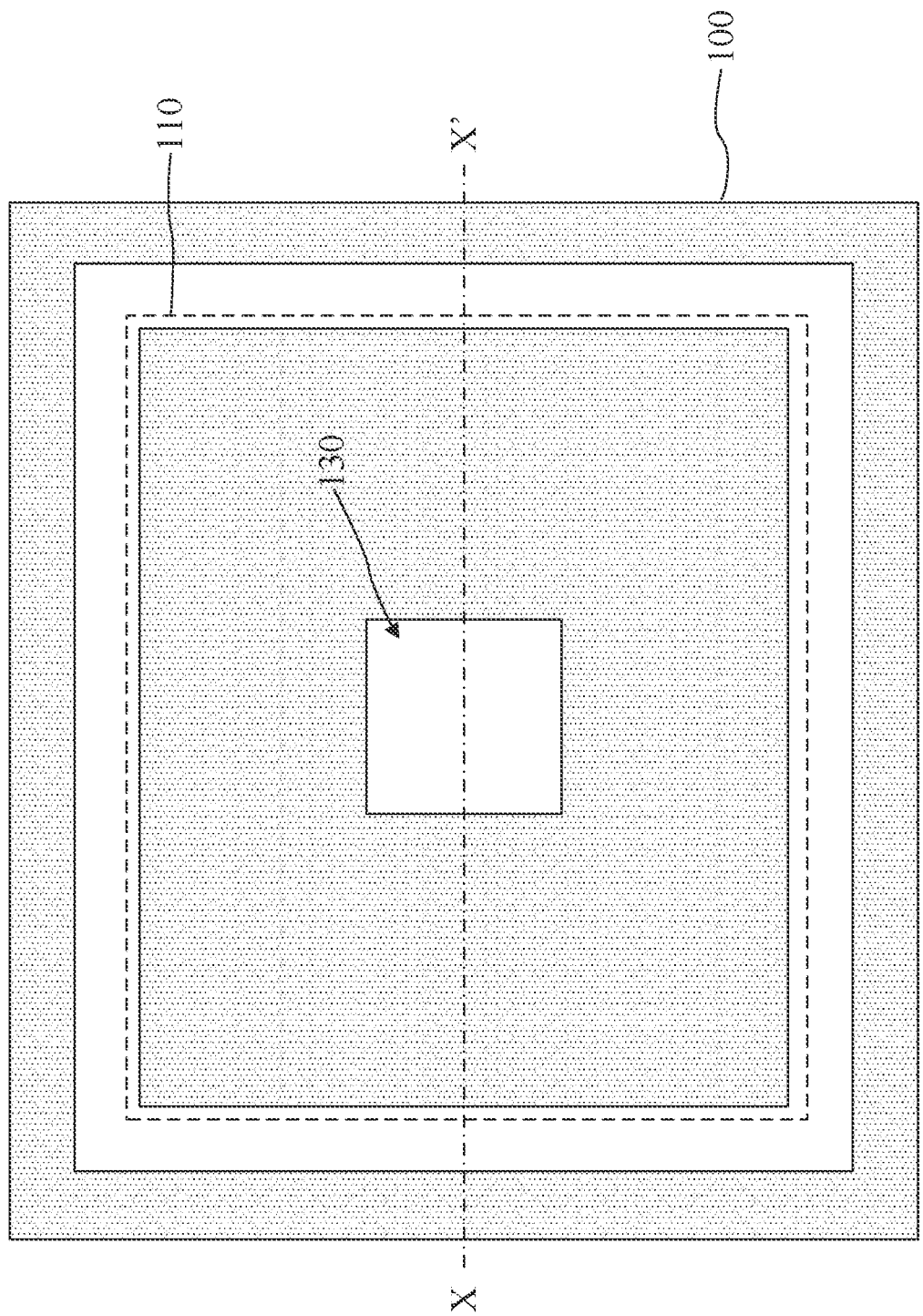
Figure 10D:
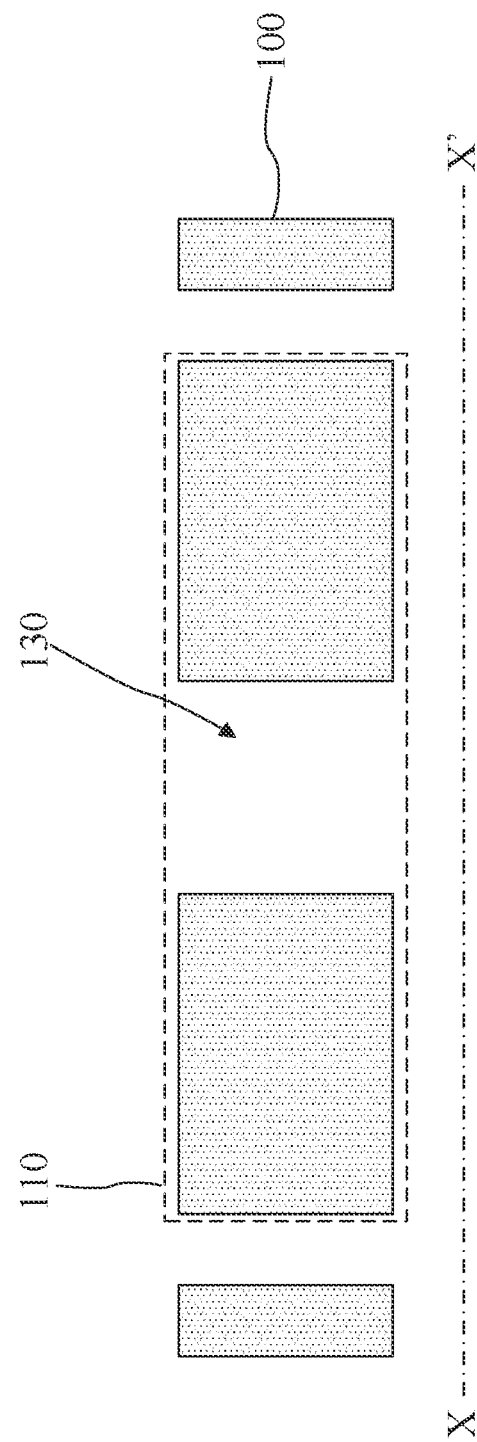

FIGS. 10C to 10F illustrate operation 702 of the method in accordance with some embodiments of the present disclosure. When operations of STI are performed for defining the transistor 110, the operations of STI are also performed for forming an isolation component 120 in the semiconductive substrate 100 of the transistor 110. As shown in FIG. 10C, the semiconductive substrate 100 is etched for defining the transistor 110. At the same time, the semiconductive substrate 100 of the transistor 110 is etched. In detail, a trench 130 is formed in the semiconductive substrate 100 of the transistor 110 while the semiconductive substrate 100 is etched for defining the transistor 110. FIG. 10D is a cross-section of the semiconductive substrate 100 in FIG. 10C.

Figure 10E:
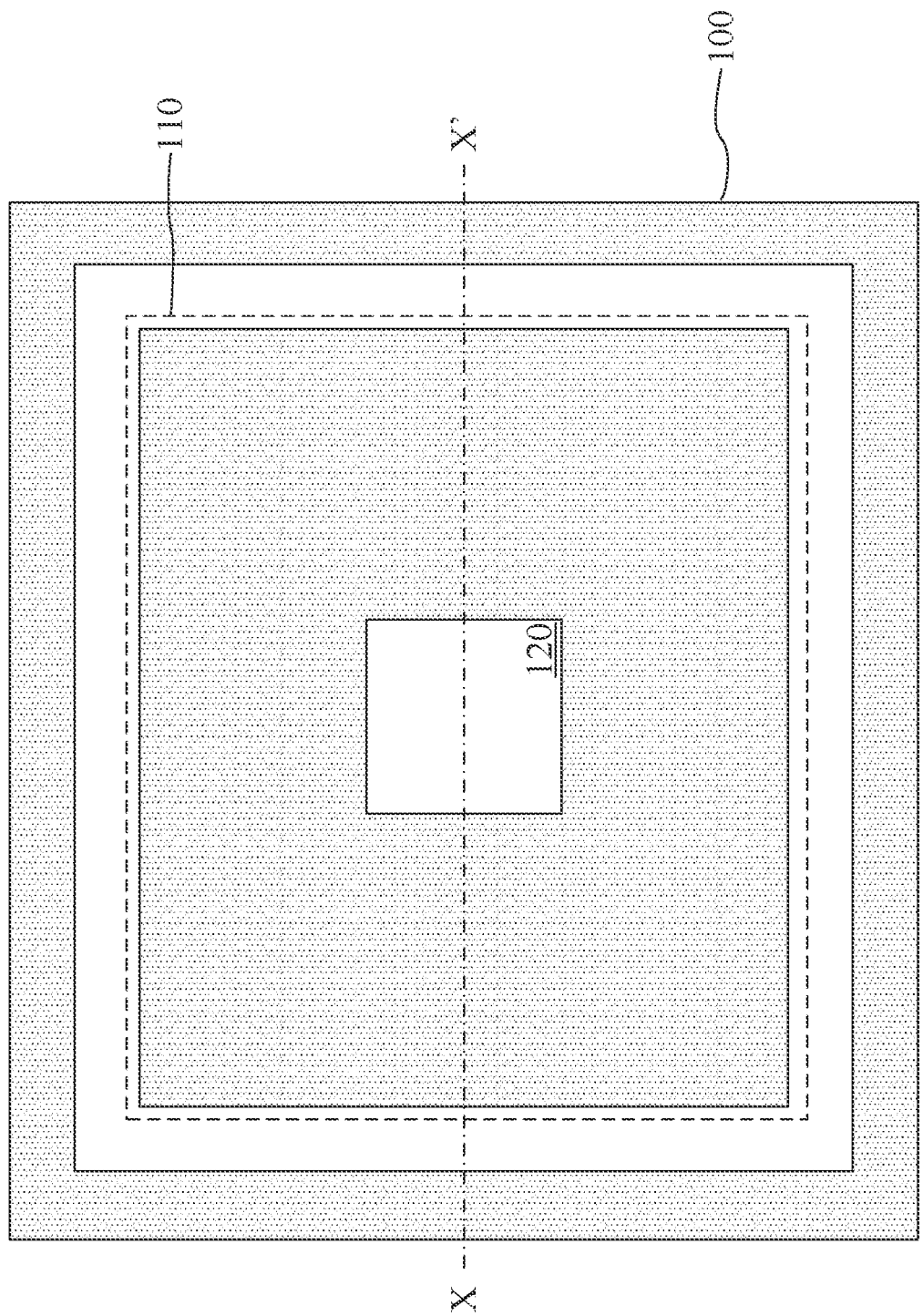
Figure 10F:
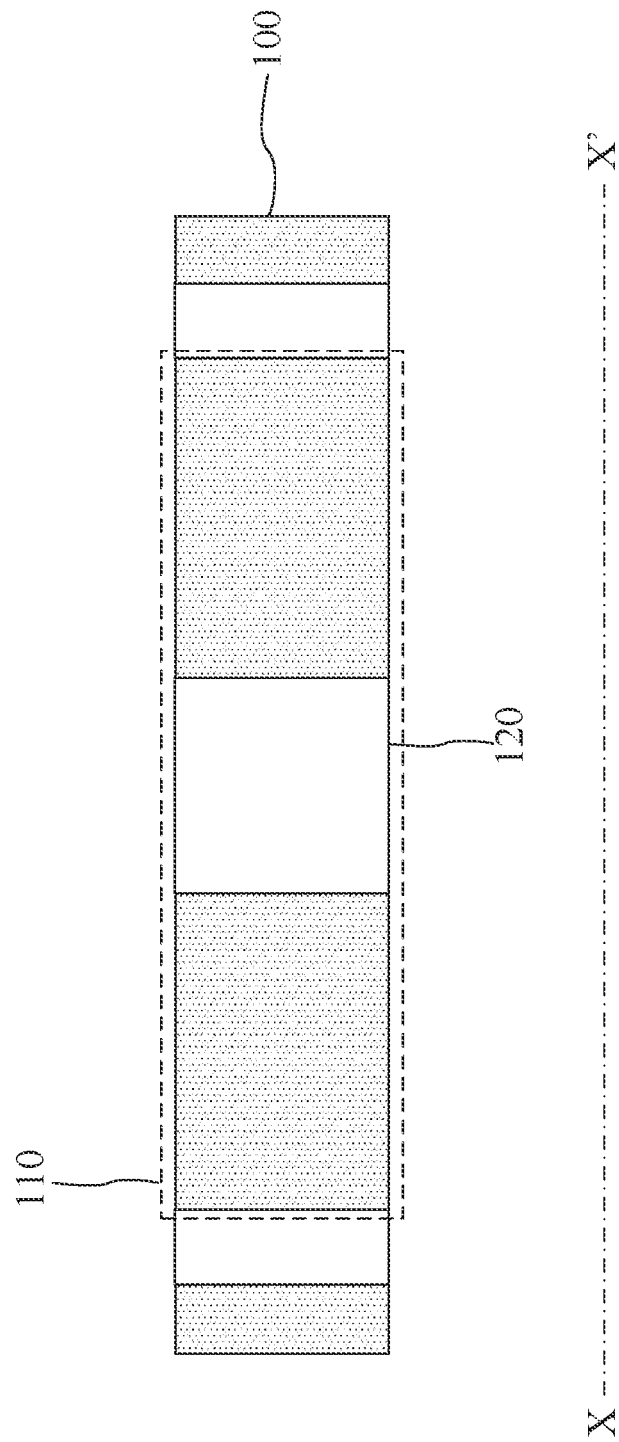

As shown in FIG. 10E, while the filling operation of STI is performed with oxide material, the trench 130 in the semiconductive substrate 100 of the transistor 110 is filled with the oxide material at the same time. Accordingly, the isolation component 120 is formed in the semiconductive substrate 100 of the transistor 110. FIG. 10F is a cross-section of the semiconductive substrate 100 in FIG. 10E.

Figure 10G:
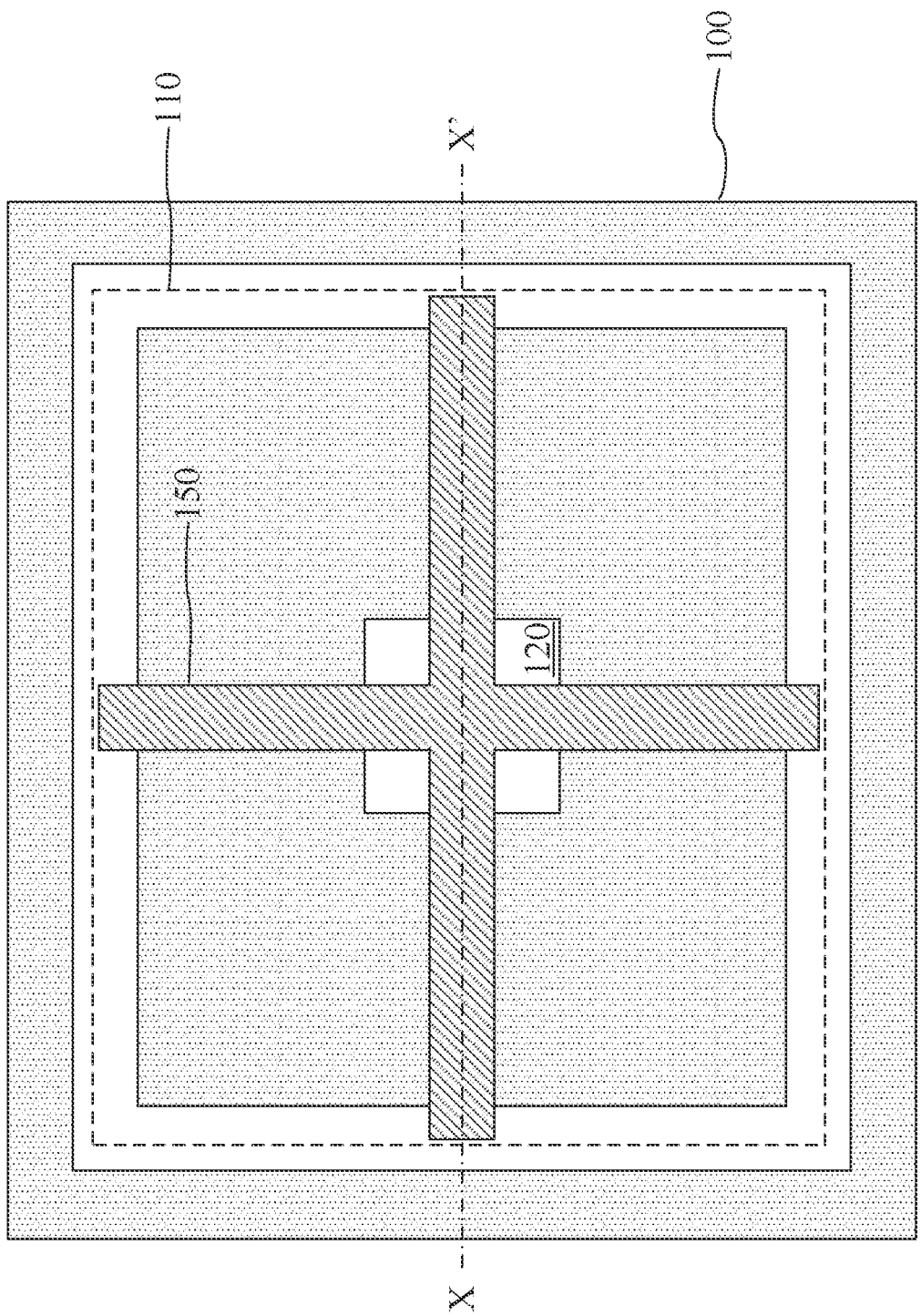
Figure 10H:
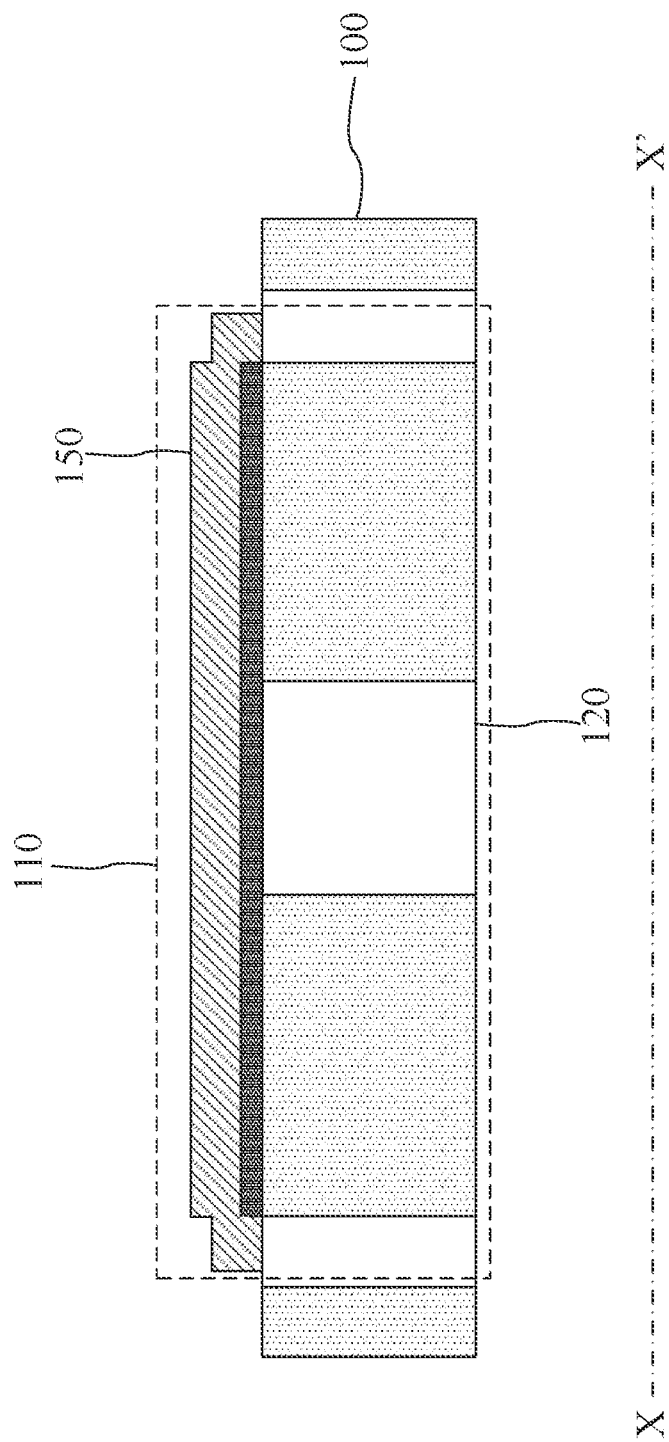
Figure 101:
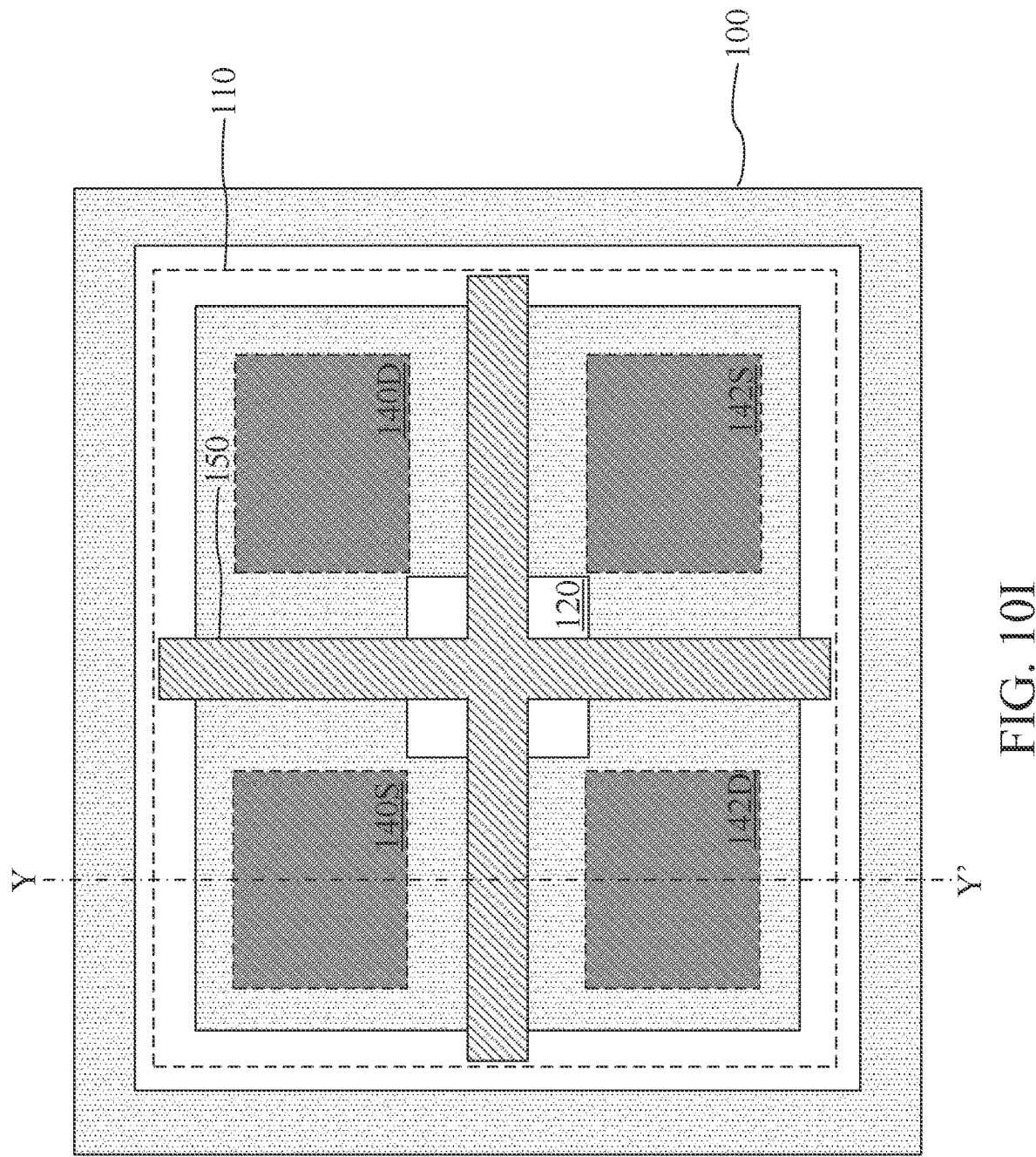
Figure 10J:
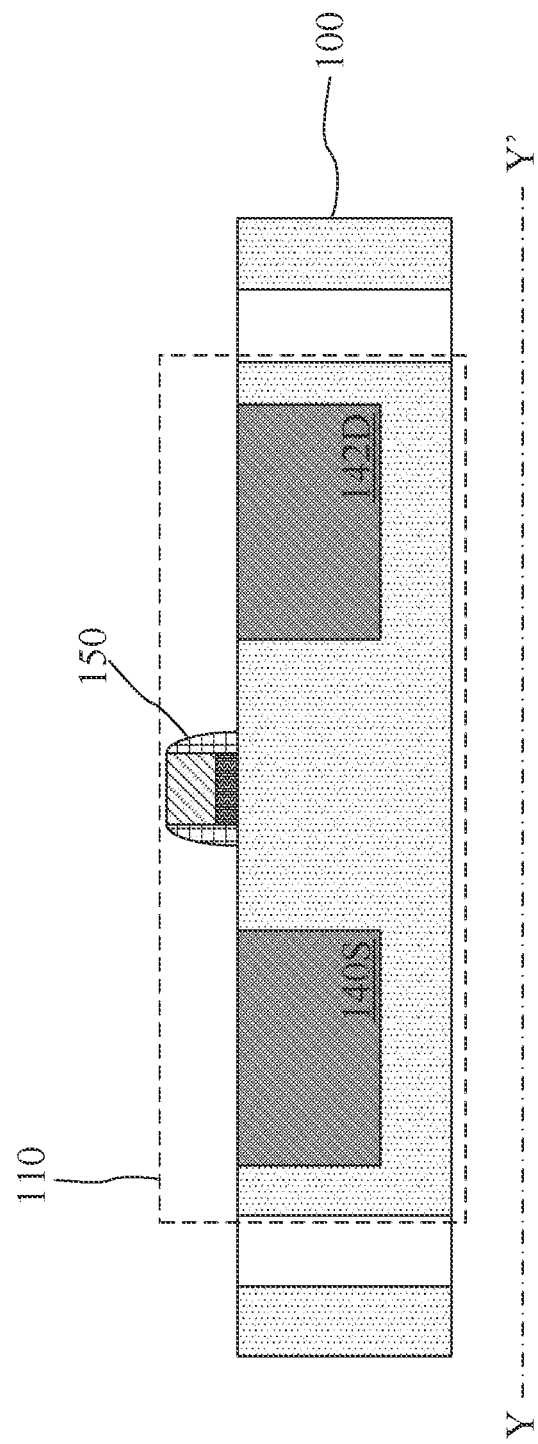

FIGS. 10G to 10H illustrate operation 703 of the method in accordance with some embodiments of the present disclosure. As shown in FIG. 10G, a gate structure 150 is formed over the semiconductive substrate 100. The gate structure 150 is in a shape of crisscross. FIG. 10H is a cross-section of the semiconductive substrate 100 in FIG. 10G. FIGS. 10I to 10J illustrate operation 704 of the method in accordance with some embodiments of the present disclosure. As shown in FIG. 10I, source regions 140S and 142S are formed in the semiconductive substrate 100, and drain regions 140D and 142D are formed in the semiconductive substrate 100.

In detail, the gate structure 150 is between the source region 140S and the drain region 140D. A channel between the source region 140S and the drain region 140D is formed away from the isolation components 120. The gate structure 150 is between the source region 142S and the drain region 142D. A channel between the source region 142S and the drain region 142D is formed away from the isolation components 120. Further, the gate structure 150 is between the source region 140S and the drain region 142D. A channel between the source region 140S and the drain region 142D is formed away from the isolation components 120. The gate structure 150 is between the source region 142S and the drain region 140D. A channel between the source region 142S and the drain region 1401D is formed away from the isolation components 120. FIG. 10J is a cross-section of the semiconductive substrate 100 in FIG. 10I.

Figure 10K:
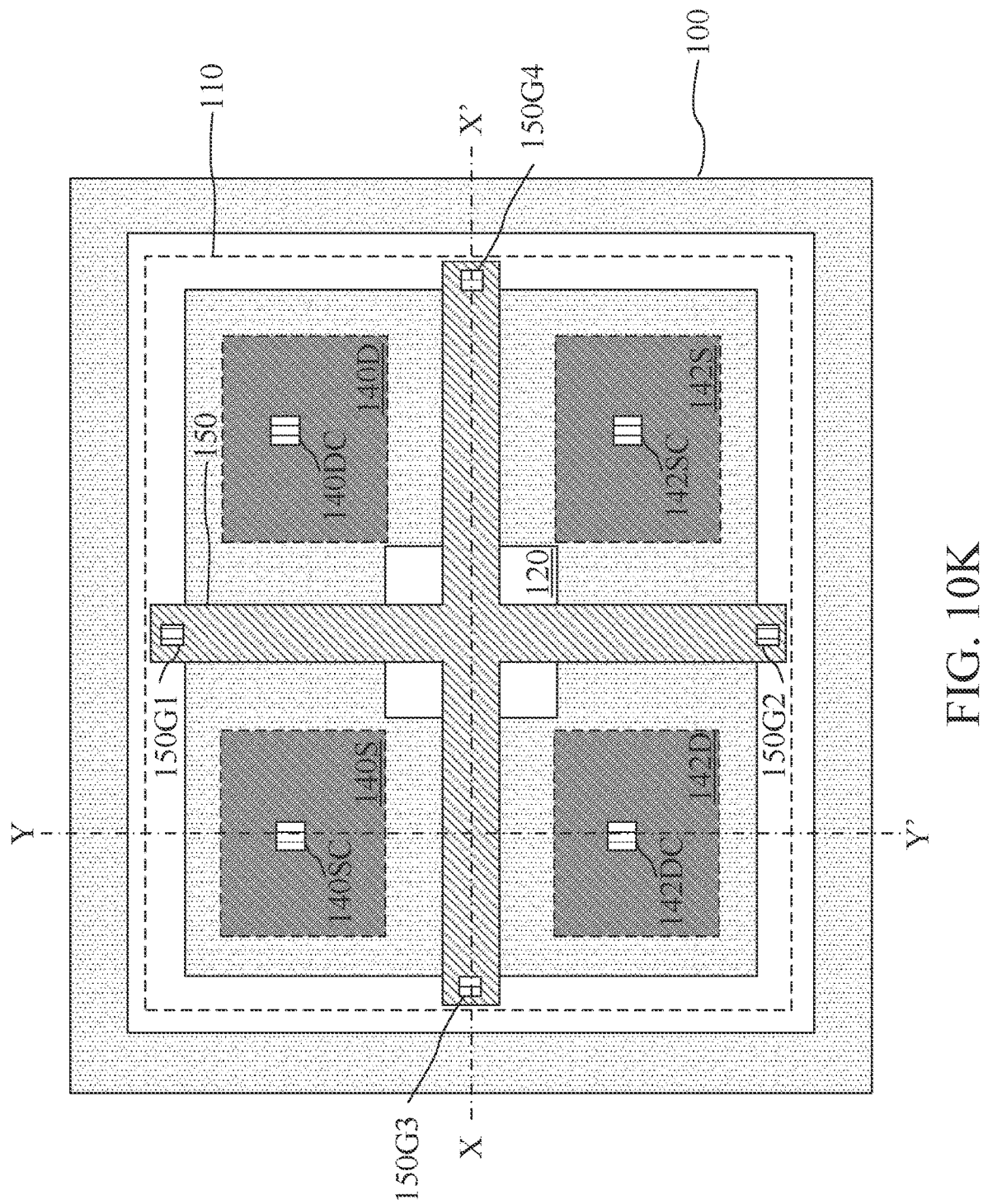
Figure 10L:
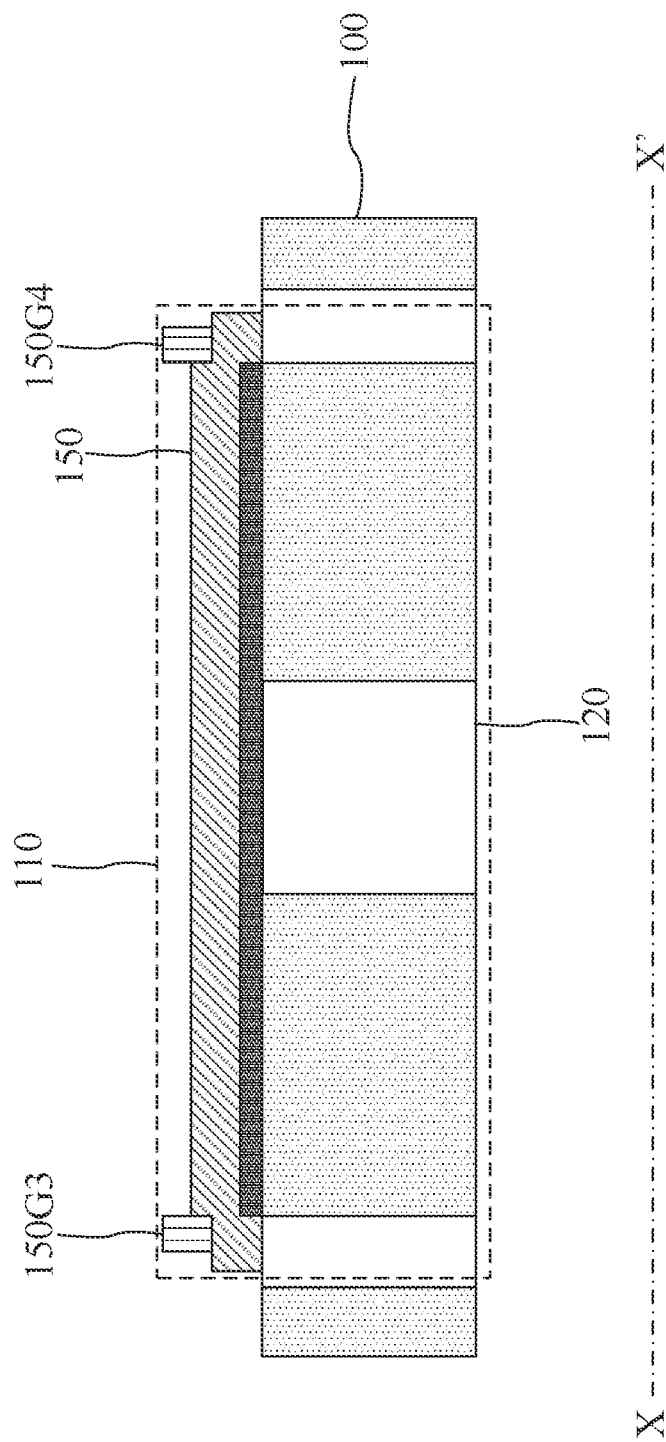
Figure 10M:
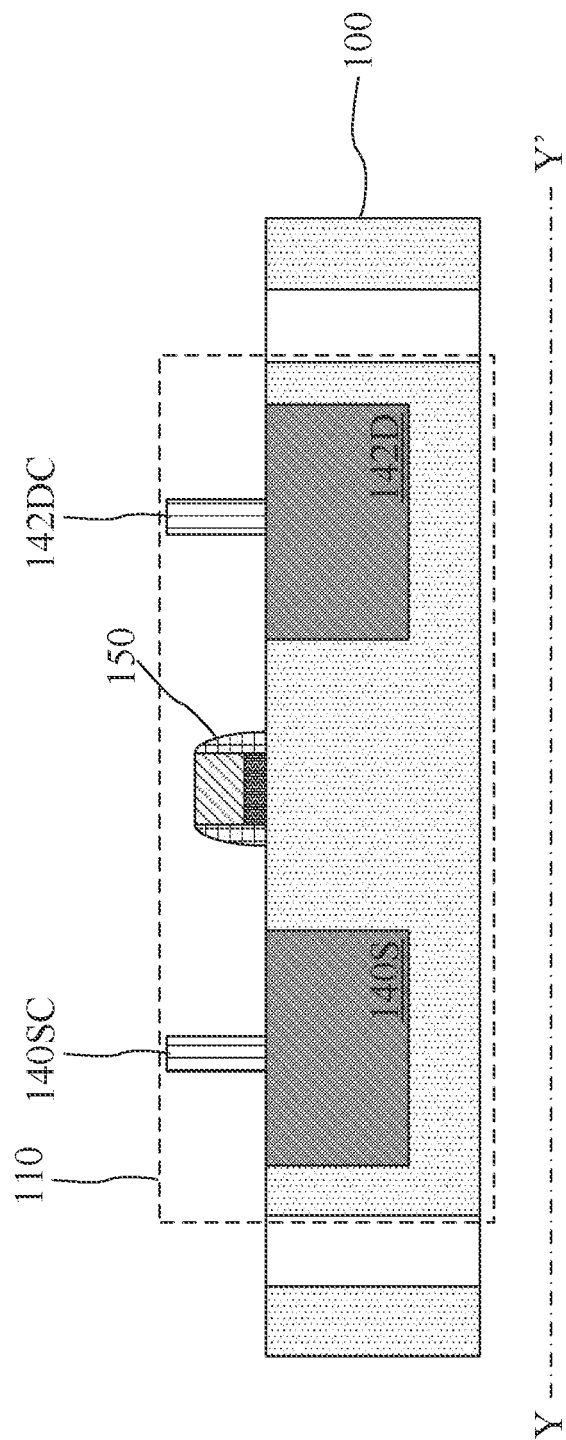

In some embodiments, contacts for the source regions, the drain regions and the gate structure may be formed. FIGS. 10K to 10M illustrate the method in accordance with some embodiments of the present disclosure. As shown in FIG. 10K, a source contact 140SC is formed on the source region 140S. A source contact 142SC is formed on the source region 142S. A drain contact 140DC is formed on the drain region 140D. A drain contact 142DC is formed on the drain region 142D. Further, gate contacts 150G1 to 150G4 are formed on a surface of the gate structure 150. In some embodiments, the gate contacts 150G1 to 150G4 are respectively formed at four ends of the gate 150 with the shape of crisscross. FIGS. 10L and 10M are cross-sections of the semiconductive substrate 100 in FIG. 10K. In some embodiments, a width of the mentioned gate or gate structure of the semiconductor structure is greater than 20 micrometers.

Some embodiments of the present disclosure provide a semiconductor structure. The semiconductor structure includes a transistor. The transistor includes a semiconductive substrate, a gate structure, a first pair of highly doped regions and a dielectric element. The semiconductive substrate has a top surface. The gate structure is over the top surface. The first pair of highly doped regions is separated by the gate structure. The dielectric element is embedded in the semiconductive substrate. The dielectric element is laterally and vertically misaligned with the first pair of highly doped regions.

Some embodiments of the present disclosure provide a semiconductor structure. The semiconductor structure includes a transistor. The transistor includes a semiconductive substrate, a first source region, a first drain region, a gate and at least one isolation component. The first source region is in the semiconductive substrate. The first drain region is in the semiconductive substrate. The gate is over the semiconductive substrate and between the first source region and the first drain region. The at least one isolation component is embedded in the semiconductive substrate. The at least one isolation component is spaced apart from a first channel formed between the first source region and the first drain region.

Some embodiments of the present disclosure provide a method for manufacturing a semiconductor structure. The method includes: providing a semiconductive substrate of a transistor; forming at least one dielectric element in the semiconductive substrate of the transistor; forming a source region and a drain region in the semiconductive substrate of the transistor, wherein a channel between the source region and the drain region is formed away from the at least one dielectric element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor structure, comprising:
a transistor, comprising:
a semiconductive substrate having a top surface;
a gate structure over the top surface, wherein the gate structure comprises a gate electrode, a dielectric layer and spacers, the dielectric layer is between the semiconductive substrate and the gate electrode, and the spacers cover the dielectric layer and part of the gate electrode, wherein a width of the gate structure is greater than 20 micrometers;
a first pair of highly doped regions separated by the gate structure, wherein a first channel is between the first pair of highly doped regions;
a second pair of highly doped regions separated by the gate structure, wherein a second channel is between the second pair of highly doped regions and a third channel is between one region of the first pair of highly doped regions and one region of the second pair of highly doped regions; and
a dielectric element embedded in the semiconductive substrate;
wherein the dielectric element is laterally and vertically misaligned with the first pair of highly doped regions and is laterally and vertically misaligned with the second pair of highly doped regions.

2. The semiconductor structure of claim 1, wherein the dielectric element is under the gate structure.

3. The semiconductor structure of claim 1, wherein the dielectric element is embedded within a center area of the semiconductive substrate.

4. The semiconductor structure of claim 1, wherein the gate structure comprises a pair of gate contacts on a surface of the gate structure.

5. The semiconductor structure of claim 1, wherein the dielectric element is spaced apart from a fourth channel formed between the second source region and the first drain region.

6. The semiconductor structure of claim 1, wherein one region of the first pair of highly doped regions has a first contact, the other region of the first pair of highly doped regions has a second contact, one region of the second pair of highly doped regions has a third contact and the other region of the second pair of highly doped regions has a fourth contact.

7. The semiconductor structure of claim 6, wherein the first contact and the second contact protrude from a surface of the semiconductive substrate.

8. The semiconductor structure of claim 1, wherein the dielectric element is spaced apart from the first channel and the second channel.

9. The semiconductor structure of claim 8, wherein the dielectric element is spaced apart from the third channel.

10. The semiconductor structure of claim 9, wherein the pair of gate contacts protrudes the surface of the gate structure.

11. A semiconductor structure, comprising:
a transistor, comprising:
a semiconductive substrate;
a first source region in the semiconductive substrate;
a first drain region in the semiconductive substrate;
a second source region in the semiconductive substrate;
a second drain region in the semiconductive substrate;
a gate over the semiconductive substrate, wherein the gate is between the first source region and the first drain region and between the second source region and the second drain region, wherein the gate comprises an electrode, a dielectric layer and spacers, the dielectric layer is between the semiconductive substrate and the electrode, and the spacers cover the dielectric layer and part of the electrode, wherein a width of the gate is greater than 20 micrometers;
at least one isolation component embedded in the semiconductive substrate;
wherein the at least one isolation component is spaced apart from a first channel formed between the first source region and the first drain region, the at least one isolation component is spaced apart from a second channel formed between the second source region and the second drain region, and the at least one isolation component is spaced apart from a third channel formed between the first source region and the second drain region.

12. The semiconductor structure of claim 11, wherein the first source region has a first source contact protruding from a surface of the semiconductive substrate and the first drain region has a first drain contact protruding from the surface of the semiconductive substrate.

13. The semiconductor structure of claim 11, wherein the second source region has a second source contact protruding from a surface of the semiconductive substrate and the second drain region has a second drain contact protruding from the surface of the semiconductive substrate.

14. The semiconductor structure of claim 11, wherein the gate is between the second source region and the first drain region, and the at least one isolation component is spaced apart from a fourth channel formed between the second source region and the first drain region.

15. The semiconductor structure of claim 11, wherein the gate is in a shape of crisscross.

16. The semiconductor structure of claim 11, wherein the isolation component is laterally and vertically misaligned with the first source region and the first drain region, and is laterally and vertically misaligned with the second source region and the second drain region.

17. The semiconductor structure of claim 11, wherein the gate has a first pair of gate contacts.

18. The semiconductor structure of claim 17, wherein the gate has a second pair of gate contacts, and the third channel is activated when the second pair of gate contacts is applied voltage.

19. A semiconductor structure, comprising:
a transistor, comprising:
a semiconductive substrate having a trench filled with oxide material;
a first source region in the semiconductive substrate;
a first drain region in the semiconductive substrate;
a second source region in the semiconductive substrate;
a second drain region in the semiconductive substrate;
a gate over the semiconductive substrate, wherein the gate is between the first source region and the first drain region and between the second source region and the second drain region, wherein the gate comprises an electrode, a dielectric layer and spacers, the dielectric layer is between the semiconductive substrate and the electrode, and the spacers cover the dielectric layer and part of the electrode, wherein a width of the gate is greater than 20 micrometers;
wherein the trench filled with oxide material is spaced apart from a first channel formed between the first source region and the first drain region, the trench filled with oxide material is spaced apart from a second channel formed between the second source region and the second drain region, and the trench filled with oxide material is spaced apart from a third channel formed between the first source region and the second drain region.

20. The semiconductor structure of claim 19, wherein the trench filled with oxide material is misaligned with the first source region, misaligned with the first drain region, misaligned with the second source region and misaligned with the second drain region.

\* \* \* \* \*